(12) United States Patent
Morita

(10) Patent No.: US 9,570,435 B2
(45) Date of Patent: Feb. 14, 2017

(54) SURGE PROTECTION ELEMENT AND SEMICONDUCTOR DEVICE

(71) Applicant: Panasonic Intellectual Property Management Co., Ltd., Osaka (JP)

(72) Inventor: Tatsuo Morita, Tokyo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/744,083

(22) Filed: Jun. 19, 2015

(65) Prior Publication Data

US 2015/0287713 A1    Oct. 8, 2015

Related U.S. Application Data

(63) Continuation of application No. PCT/JP2013/006449, filed on Oct. 31, 2013.

(30) Foreign Application Priority Data

Dec. 26, 2012 (JP) ................................. 2012-282168

(51) Int. Cl.
*H01L 23/62* (2006.01)
*H01L 27/02* (2006.01)
(Continued)

(52) U.S. Cl.
CPC ....... *H01L 27/0255* (2013.01); *H01L 27/0248* (2013.01); *H01L 29/2003* (2013.01);
(Continued)

(58) Field of Classification Search
CPC ............... H01L 27/0255; H01L 29/872; H01L 27/0248; H01L 29/861; H01L 29/2003; H01L 29/7787; H01L 29/0692; H01L 27/0605
See application file for complete search history.

(56) References Cited

U.S. PATENT DOCUMENTS

2006/0273347 A1    12/2006 Hikita et al.
2008/0211567 A1*   9/2008 Morita ................. H03K 17/302
                                                                327/425
(Continued)

FOREIGN PATENT DOCUMENTS

JP    2002-093999    3/2002
JP    2006-339561    12/2006
(Continued)

OTHER PUBLICATIONS

International Search Report of PCT application No. PCT/JP2013/006449 dated Feb. 10, 2014.

*Primary Examiner* — Victor A Mandala
(74) *Attorney, Agent, or Firm* — McDermott Will & Emery LLP

(57) ABSTRACT

A semiconductor element is provided which does not break down by avalanche current. A surge protection element includes: a semiconductor multi-layer comprising a nitride semiconductor; a first p-type semiconductor and a second p-type semiconductor which are disposed above the semiconductor multi-layer; a first electrode disposed above the first p-type semiconductor; and a second electrode disposed above the second p-type semiconductor.

20 Claims, 20 Drawing Sheets

(51) Int. Cl.
- *H01L 29/778* (2006.01)
- *H01L 29/861* (2006.01)
- *H01L 29/20* (2006.01)
- *H01L 29/872* (2006.01)
- *H01L 27/06* (2006.01)
- *H01L 29/06* (2006.01)
- *H01L 29/10* (2006.01)

(52) U.S. Cl.
CPC ........ *H01L 29/7787* (2013.01); *H01L 29/861* (2013.01); *H01L 29/872* (2013.01); *H01L 27/0605* (2013.01); *H01L 29/0692* (2013.01); *H01L 29/1066* (2013.01)

(56) References Cited

U.S. PATENT DOCUMENTS

| | | |
|---|---|---|
| 2009/0166677 A1 | 7/2009 | Shibata et al. |
| 2010/0327293 A1 | 12/2010 | Hikita et al. |
| 2011/0193171 A1 | 8/2011 | Yamagiwa et al. |
| 2012/0217542 A1* | 8/2012 | Morita ............. H01L 27/0605 257/140 |
| 2012/0256233 A1 | 10/2012 | Cui et al. |
| 2012/0299011 A1 | 11/2012 | Hikita et al. |
| 2013/0032823 A1* | 2/2013 | Hayashi ............. H01L 21/8213 257/77 |
| 2013/0232462 A1* | 9/2013 | Ueno ............. H01L 21/8252 716/136 |

FOREIGN PATENT DOCUMENTS

| | | | | |
|---|---|---|---|---|
| JP | 2009-164158 | 7/2009 | | |
| JP | 2009-295650 | 12/2009 | | |
| JP | 2011-087368 | 4/2011 | | |
| JP | WO 2011064955 | * 6/2011 | ............. | H01L 29/80 |
| JP | 2011-165749 | 8/2011 | | |

\* cited by examiner

SURGE PROTECTION ELEMENT AND SEMICONDUCTOR DEVICE

CROSS REFERENCE TO RELATED APPLICATION

This is a continuation application of PCT International Application No. PCT/JP2013/006449 filed on Oct. 31, 2013, designating the United States of America, which is based on and claims priority of Japanese Patent Application No. 2012-282168 filed on Dec. 26, 2012. The entire disclosures of the above-identified applications, including the specifications, drawings and claims are incorporated herein by reference in their entirety.

BACKGROUND OF THE INVENTION

1. Field of the Invention

The present disclosure relates to surge protection elements and semiconductor devices.

2. Description of the Related Art

Gallium nitride (GaN)-based wide bandgap semiconductor has a dielectric breakdown field strength higher than that of semiconductor such as silicon (Si), and a saturated drift velocity of electrons higher than that of compound semiconductor such as gallium arsenide (GaAs) or Si semiconductor. Accordingly, the GaN-based wide bandgap semiconductor is expected to serve as materials for a power semiconductor device which conducts large current with high breakdown voltage. In particular, in a hetero structure of AlGaN/GaN, electric charges are generated on a (0001) plane of the GaN layer at the interface between the AlGaN layer and the GaN layer by spontaneous polarization and piezoelectric polarization. This provides a sheet carrier concentration of $1 \times 10^{13}$ cm$^{-2}$ or higher and a high mobility of 1000 cm$^2$ V/sec or higher even if the AlGaN layer and the GaN layer are undoped. Accordingly, a hetero-junction field effect transistor which uses two dimensional electron gas at the heterointerface provides a low on-resistance power transistor.

For the purpose of use as a power control device, there is a need for a normally-off GaN-based hetero-junction field effect transistor which interrupts current between source and drain at the gate voltage of 0 V similarly to a conventional Si-based power MOS transistor. Such a normally-off GaN-based hetero-junction field effect transistor can be provided by including a structure in which a p-type semiconductor layer is disposed between a gate electrode and an AlGaN layer, as disclosed in Patent Literature (PTL) 1.

Although the GaN-based hetero-junction field effect transistor has excellent device characteristics as described above, the structure disclosed in PTL 1 has a problem in that the avalanche resistance which is an index indicating the robustness of a power device is extremely low. A transistor having a low avalanche resistance easily breaks down upon application of a surge voltage exceeding the rated breakdown voltage of the transistor.

In order to improve the avalanche resistance of a GaN-based transistor, PTL 2 discloses a technique in which a diode including Si having a high avalanche resistance is integrated on a substrate of the GaN-based transistor. Specifically, PTL 2 discloses a structure in which current is actively conducted through the diode at the time of avalanche current conduction so as to improve avalanche resistance substantially.

CITATION LIST

Patent Literature

PTL 1: Japanese Unexamined Patent Application Publication No. 2006-339561
PTL 2: Japanese Unexamined Patent Application Publication No. 2009-164158

SUMMARY OF THE INVENTION

Manufacturing a transistor including the structure disclosed in PTL 2, however, requires an extra process for forming the diode in a Si substrate. Hence, the manufacturing of the transistor including the structure disclosed in PTL 2 requires an additional cost for the process for forming the diode in comparison to a transistor without the diode.

The present disclosure has been conceived in view of the above problem. An object of the present disclosure is to provide a surge protection element which substantially increases the avalanche resistance of a power device without requiring a complicated process.

In order to solve the above problem, the surge protection element according to one embodiment of the present disclosure includes: a substrate; a semiconductor multi-layer disposed above the substrate and including a channel and comprising a nitride semiconductor; a first p-type semiconductor layer and a second p-type semiconductor layer which are disposed above the semiconductor multi-layer; a first electrode disposed above the first p-type semiconductor layer; and a second electrode disposed above the second p-type semiconductor layer. Such a structure causes current conduction between the first electrode and the second electrode, allowing excess voltage to be absorbed.

The surge protection element may further include: a first ohmic electrode disposed above the semiconductor multi-layer; a second ohmic electrode disposed above the semiconductor multi-layer; and a first resistance. It may be that the first p-type semiconductor layer is disposed between the first ohmic electrode and the second p-type semiconductor layer, the second p-type semiconductor layer is disposed between the first p-type semiconductor layer and the second ohmic electrode, and the first ohmic electrode is electrically connected to the first electrode via the first resistance, and the second ohmic electrode is electrically connected to the second electrode. Such a structure causes current conduction both between the first electrode and the second electrode and between the first ohmic electrode and the second ohmic electrode, allowing excess voltage to be absorbed.

Moreover, it may be that the first ohmic electrode is electrically connected to the first electrode via a first diode including the first electrode as an anode and the first ohmic electrode as a cathode. Such a structure makes variation in on-voltage of the diode relative to current less than that in the case where a resistance is connected. This more reliably causes current conduction between the first ohmic electrode and the second ohmic electrode, thereby absorbing excess voltage.

The first diode may be connected in parallel with a first resistance. Such a structure more reliably allows leak current to be interrupted even at application of a high voltage to the surge protection element.

Moreover, it may be that the second ohmic electrode is electrically connected to the second electrode via a second resistance. Such a structure provides a symmetrical structure. Hence, even at application of either positive or negative excess voltage, the excess voltage can be absorbed.

Moreover, it may be that the second ohmic electrode is electrically connected to the second electrode via a second diode including the second ohmic electrode as a cathode and the second electrode as an anode, and that the second diode is connected in parallel with the second resistance. Such a structure provides a symmetrical structure. Hence, even at application of either positive or negative excess voltage, the excess voltage can be absorbed. Furthermore, variation in on-voltage of the diode relative to current is less than that in the case where a resistance is connected. This more reliably causes current conduction between the first ohmic electrode and the second ohmic electrode.

Moreover, a semiconductor device may include a surge protection element, and a nitride semiconductor transistor including a source electrode, a drain electrode, and a gate electrode which are disposed above the semiconductor multi-layer. It may be that the source electrode is electrically connected to the first electrode of the surge protection element and the drain electrode is electrically connected to the second electrode of the surge protection element. Such a structure allows excess voltage to be absorbed, and also allows a semiconductor device which also operates as a transistor to be configured with a single chip.

Moreover, a semiconductor device may include a surge protection element and a nitride semiconductor transistor including a source electrode, a drain electrode, and a gate electrode which are disposed above the semiconductor multi-layer. It may be that the source electrode is electrically connected to the first ohmic electrode of the surge protection element, and the drain electrode is electrically connected to the second ohmic electrode of the surge protection element. Such a structure allows current conduction between the first ohmic electrode and the second ohmic electrode as well, excess voltage to be absorbed, and a semiconductor device which also operates as a transistor to be configured with a single chip.

Moreover, it may be that the first resistance includes a portion of the first p-type semiconductor layer. Such a structure eliminates the need for manufacturing the resistance in an extra process, thereby simplifying the manufacturing process.

Moreover, it may be that the first resistance includes a portion of the semiconductor multi-layer. Such a structure eliminates the need for manufacturing the resistance in an extra process, thereby simplifying the manufacturing process.

Moreover, it may be that the first resistance includes a portion of a metal film. Such a structure allows a resistance value to be set lower, thereby increasing design flexibility of the semiconductor device.

Moreover, it may be that the first diode includes a portion of the first p-type semiconductor and a portion of the semiconductor multi-layer. Such a structure eliminates the need for manufacturing the diode in an extra process, thereby simplifying the manufacturing process.

Moreover, it may be that the first diode includes a schottky electrode and a portion of the semiconductor multi-layer. Such a structure allows a diode having a desired offset value to be formed, thereby increasing design flexibility of the semiconductor device.

Moreover, it may be that a p-type semiconductor layer is disposed between the semiconductor multi-layer and the gate electrode. Such a structure allows the offset voltage of the diode to be higher, thereby more reliably causing current conduction between the first ohmic electrode and the second ohmic electrode.

Moreover, a semiconductor device may include: a surge protection element; and a nitride semiconductor bidirectional switch including a third ohmic electrode, a fourth ohmic electrode, a third gate electrode, and a fourth gate electrode which are disposed above the semiconductor multi-layer. It may be that the third ohmic electrode is electrically connected to the first electrode, and the fourth ohmic electrode is electrically connected to the second electrode. Such a structure allows excess voltage to be absorbed and a semiconductor device which also operates as a bidirectional switch which controls bidirectional current to be configured with a single chip.

Moreover, it may be that a third p-type semiconductor layer is disposed between the semiconductor multi-layer and the third gate electrode, and a fourth p-type semiconductor layer is disposed between the semiconductor multi-layer and the fourth gate electrode. Such a structure allows excess voltage to be absorbed and a semiconductor device which also operates as a bidirectional switch which controls bidirectional current to be configured with a single chip.

According to the surge protection element in the present disclosure, it is possible to provide a reliable power semiconductor device without causing breakdown of a transistor even at application of a surge voltage exceeding the rated breakdown voltage of the transistor.

DETAILED DESCRIPTION OF THE PREFERRED EMBODIMENTS

Hereinafter, embodiments according to the present disclosure will be described with reference to the drawings. In the following embodiments, duplicate description of structural elements that are substantially the same may be omitted. It is to be noted that the present disclosure is not limited to the following embodiments.

Prior to describing the embodiments, a description is given of a mechanism of breakdown of a GaN-based field-effect transistor having a low avalanche resistance which occurs upon application of a surge voltage exceeding the rated breakdown voltage of the transistor.

(Breakdown Mechanism)

Figure 17:
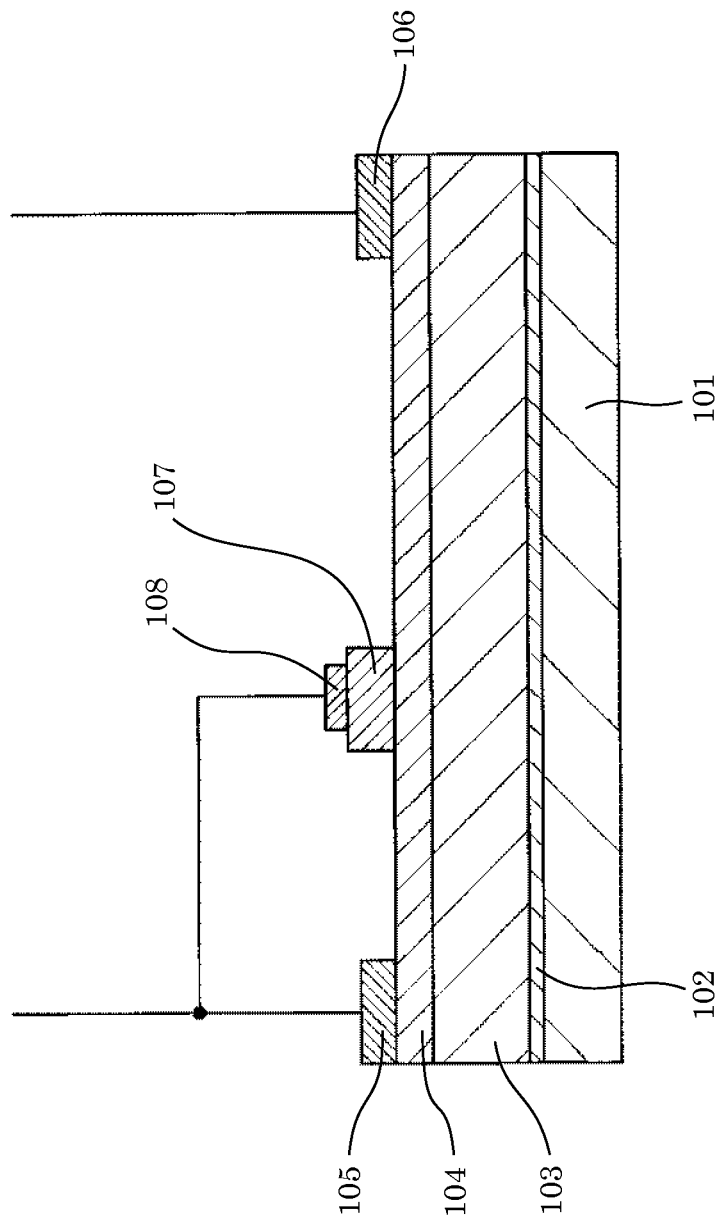
FIG. 17 is a cross-sectional view of a GaN-based transistor according to Patent Literature 1.

FIG. 17 is a schematic cross-sectional view of a structure of a conventional GaN-based transistor disclosed in PTL 1. Buffer layer 102, GaN layer 103, and AlGaN layer 104 are sequentially stacked on Si substrate 101 in this order. A two-dimensional electron gas to serve as a channel is generated at the interface between AlGaN layer 104 and GaN layer 103.

Source electrode 105, p-type GaN layer 107, and drain electrode 106 are stacked on AlGaN layer 104. Source electrode 105 and drain electrode 106 each comprise, for example, titanium (Ti) and aluminum (Al), and form an ohmic contact with the channel.

Gate electrode 108 is disposed on p-type GaN layer 107. Gate electrode 108 comprises, for example, palladium (Pd) and gold (Au), and forms an ohmic contact with p-type GaN layer 107.

The GaN-based transistor illustrated in FIG. 17 includes p-type GaN layer 107 between gate electrode 108 and AlGaN layer 104, allowing the transistor to operate as a normally-off transistor. Hence, the threshold voltage at which current starts to flow from drain electrode 106 to source electrode 105 can be set to, for example, 1 V approximately.

FIG. 17 illustrates a state where gate electrode 108 and source electrode 105 are electrically connected. In this state, current flow from drain electrode 106 to source electrode 105 can be interrupted. Upon application of a voltage exceeding the device breakdown voltage between drain electrode 106 and source electrode 105 in this state, a large part of the applied voltage is applied between drain electrode 106 and p-type GaN layer 107. This causes an avalanche current to flow from drain electrode 106 to gate electrode 108 via p-type GaN layer 107. The value of the avalanche current, however, is small, which is an insufficient avalanche current. As a result, the field-effect transistor as illustrated in FIG. 17 has a low avalanche resistance.

In an AlGaN/GaN field-effect transistor which includes no p-type GaN layer and includes a gate electrode on an AlGaN layer in contact with each other (see FIG. 15 of PTL 1), too, a small avalanche current flows from the drain electrode to the gate electrode, which results in a low avalanche resistance.

Even if a large avalanche current flows through such an AlGaN/GaN field-effect transistor, the current flows via gate electrode 108, which may cause breakdown of the gate driving circuit connected to gate electrode 108. Hence, such a transistor has a structure in which avalanche current mainly flows from drain electrode 106 to source electrode 105.

It has been described above that the avalanche current which flows from drain electrode 106 to gate electrode 108 is small. The avalanche current which flows from source electrode 105 to gate electrode 108 is also small. Accordingly, in order to improve a breakdown voltage relative to a surge voltage, the present disclosure has a structure which causes large avalanche current to flow both between the gate and the drain and between the gate and the source.

Embodiment 1

Figure 1:
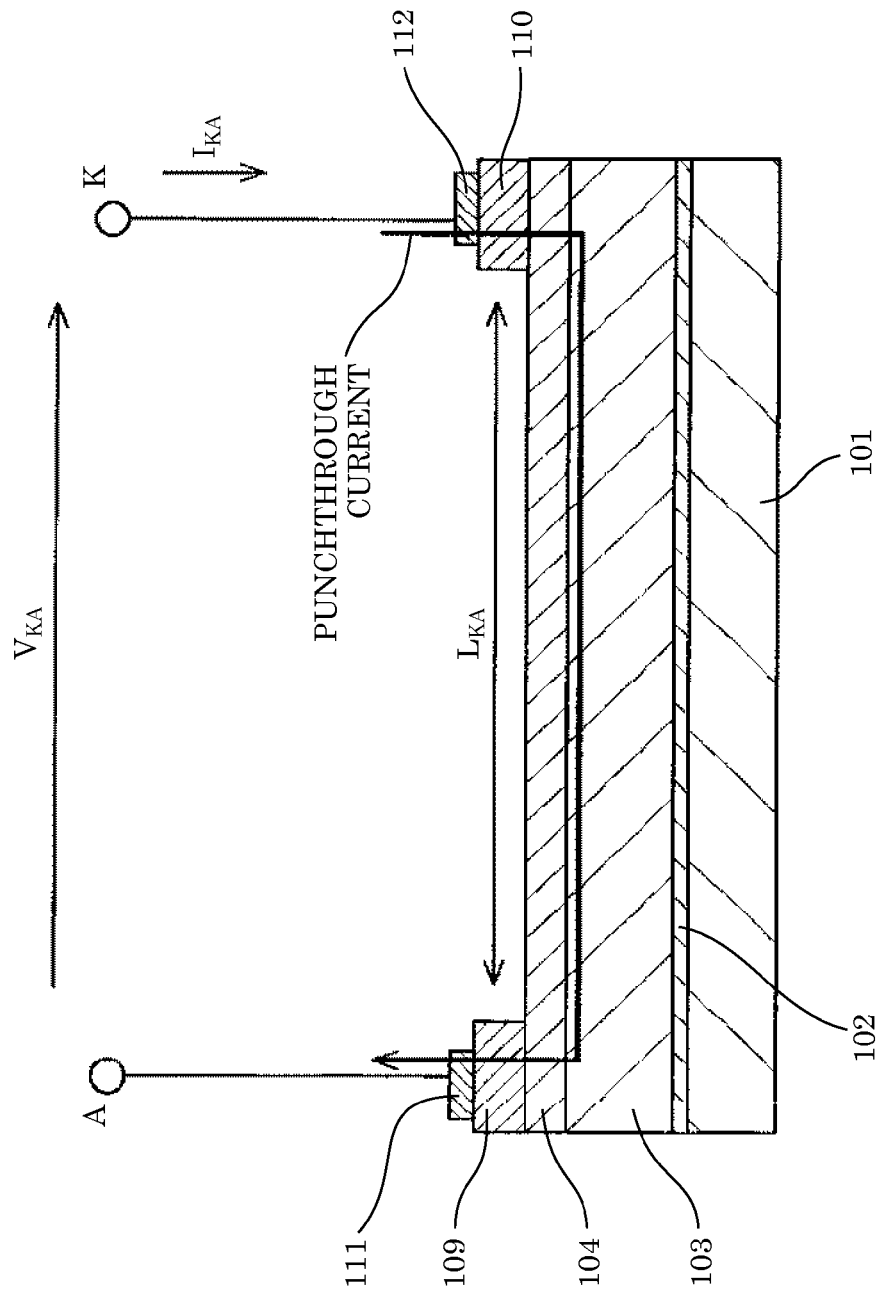
FIG. 1 is a cross-sectional view of a surge protection element according to Embodiment 1 of the present disclosure.

FIG. 1 is a cross-sectional view of a surge protection element according to Embodiment 1.

Buffer layer 102, GaN layer 103, and AlGaN layer 104 are sequentially stacked on Si substrate 101 in this order. A two-dimensional electron gas layer to serve as a channel is generated at the interface between AlGaN layer 104 and GaN layer 103. Finger-shaped first p-type GaN layer 109 and finger-shaped second p-type GaN layer 110 each of which extends in the direction perpendicular to the drawing sheet are disposed on AlGaN layer 104. In the present description, the terms "on" or "above" refer to a direction from Si substrate 101 to AlGaN layer 104.

First electrode 111 is disposed on first p-type GaN layer 109, and second electrode 112 is disposed on second p-type GaN layer 110. First electrode 111 and second electrode 112 each comprise, for example, palladium (Pd) and gold (Au). First electrode 111 is disposed such that first p-type GaN layer 109 contacts palladium (Pd) and that Au is disposed on Pd. First electrode 111 forms an ohmic contact with first p-type GaN layer 109. Second electrode 112 is disposed such that second p-type GaN layer 110 contacts Pd and that Au is disposed on Pd. Second electrode 112 forms an ohmic contact with second p-type GaN layer 110. First electrode 111 is electrically connected to terminal A. Second electrode 112 is electrically connected to terminal K. A voltage applied between terminal K and terminal A is referred to $V_{KA}$, and a current which flows from terminal K to terminal A is referred to $I_{KA}$.

With such a structure, it can be considered that the surge protection element according to Embodiment 1 includes a PNP bipolar transistor including first p-type GaN layer 109 as p-type, AlGaN layer 104 and GaN layer 103 as n-type, and second p-type GaN layer 110 as p-type.

When voltage $V_{KA}$ is applied between terminal K and terminal A so that terminal K is positive and terminal A is negative, for example, a depletion layer spreads from first p-type GaN layer 109 to AlGaN layer 104 and GaN layer 103. In other words, since a depletion layer spreads in the base of the PNP bipolar transistor, when voltage $V_{KA}$ is higher than or equal to a predetermined voltage (hereinafter, clamp voltage), punchthrough current flows from terminal K to terminal A via second p-type GaN layer 110, the channel, and first p-type GaN layer 109. As described above, the PNP bipolar transistor uses the punchthrough current instead of avalanche current so as to conduct current at the set clamp voltage, and functions as a surge protection element which absorbs excess voltage.

Figure 2:
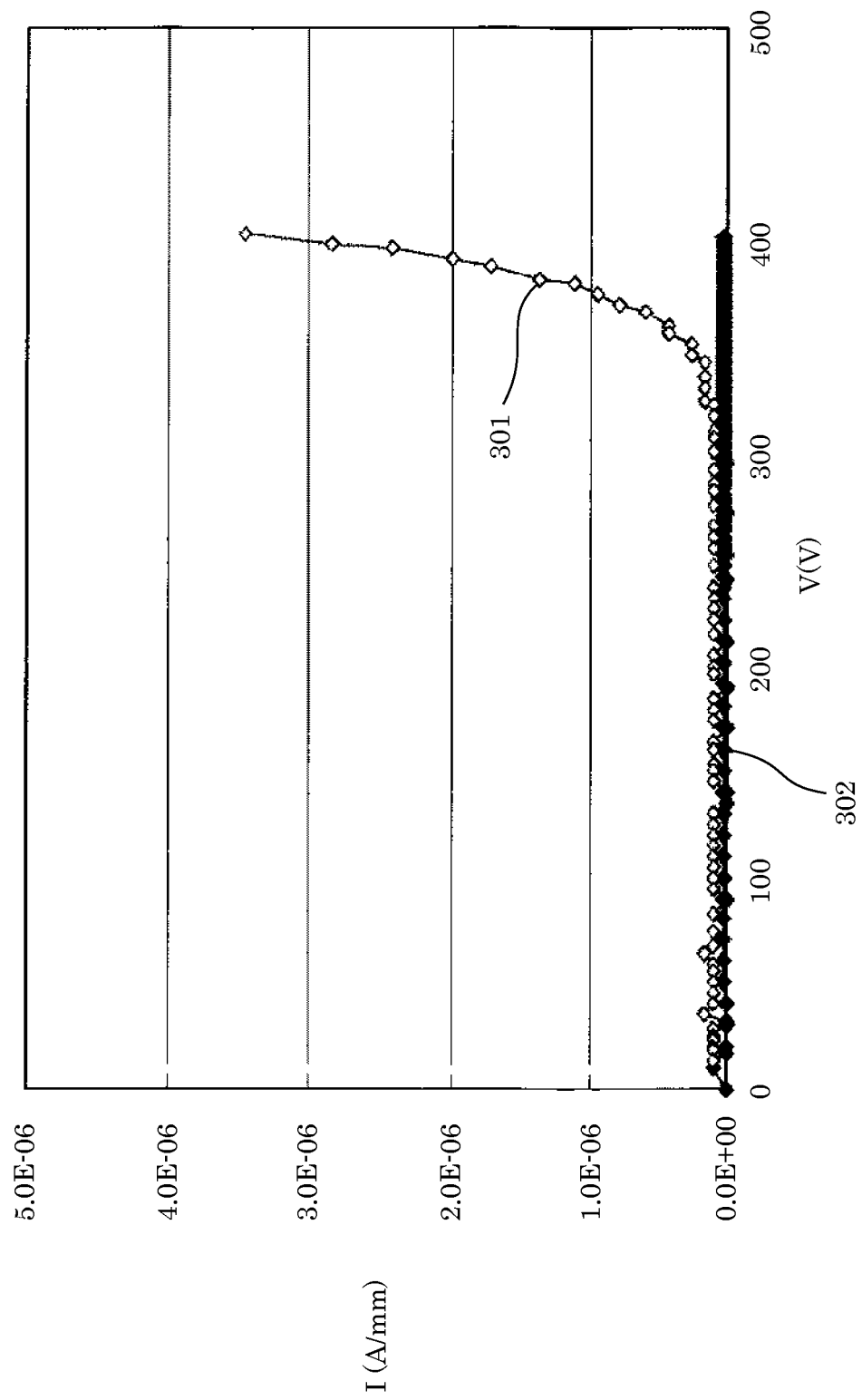
FIG. 2 illustrates current-voltage characteristics of the surge protection element according to Embodiment 1 of the present disclosure.

FIG. 2 illustrates current-voltage characteristics of the surge protection element according to Embodiment 1. The horizontal axis represents $V_{KA}$ [V], and the vertical axis represents $I_{KA}$ [A/mm]. $I_{KA}$ indicates a current value obtained when the finger-shaped first p-type GaN layer 109 and finger-shaped second p-type GaN layer 110, where current conducts, each have a length of 1 mm in the longitudinal direction (direction perpendicular to the drawing sheet).

In FIG. 2, characteristics 301 indicate current-voltage characteristics of the surge protection element according to Embodiment 1, and characteristics 302 indicate current-voltage characteristics of the conventional GaN transistor illustrated in FIG. 17. As illustrated in FIG. 2, the surge protection element according to Embodiment 1 can conduct current upon application of a high voltage in comparison to the conventional GaN transistor. For example, the surge protection element according to Embodiment 1 can conduct current approximately 100 times or more as large as current conducted through the conventional GaN transistor upon application of 400 V.

The clamp voltage can be set by distance $L_{KA}$ between an end of first p-type GaN layer 109 on second p-type GaN layer 110 side and an end of second p-type GaN layer 110 on first p-type GaN layer 109 side. Increase in distance $L_{KA}$ leads to increase in clamp voltage, and decrease in distance $L_{KA}$ leads to decrease in clamp voltage. Accordingly, when the surge protection element according to Embodiment 1 is connected in parallel with a transistor, for example, the avalanche resistance of the transistor can be substantially and significantly increased by setting the clamp voltage of the surge protection element to be higher and lower than the rated breakdown voltage of the transistor.

Embodiment 1 has described the example where Si substrate 101 is used. In the case of use of an electrically conductive substrate, it is preferable to set distance $L_{KA}$ such that the clamp voltage of the surge protection element is lower than the breakdown voltage between second electrode 112 and Si substrate 101 or between first electrode 111 and Si substrate 101. Such a structure reliably causes punchthrough current between first electrode 111 and second electrode 112, thereby absorbing excess voltage. When the substrate is not electrically conductive but has insulation properties, the above consideration is unnecessary.

Since the surge protection element according to Embodiment 1 has a symmetric structure, the surge protection element can have both positive and negative clamp voltages and conduct current. Accordingly, by connecting the surge protection element according to Embodiment 1 in parallel with a bidirectional switch which withstands both positive and negative voltages, instead of a transistor which withstands only positive or negative voltage, the avalanche resistance for positive and negative voltages can be substantially and significantly increased.

Embodiment 2

A surge protection element according to Embodiment 2 will be described.

Figure 3:
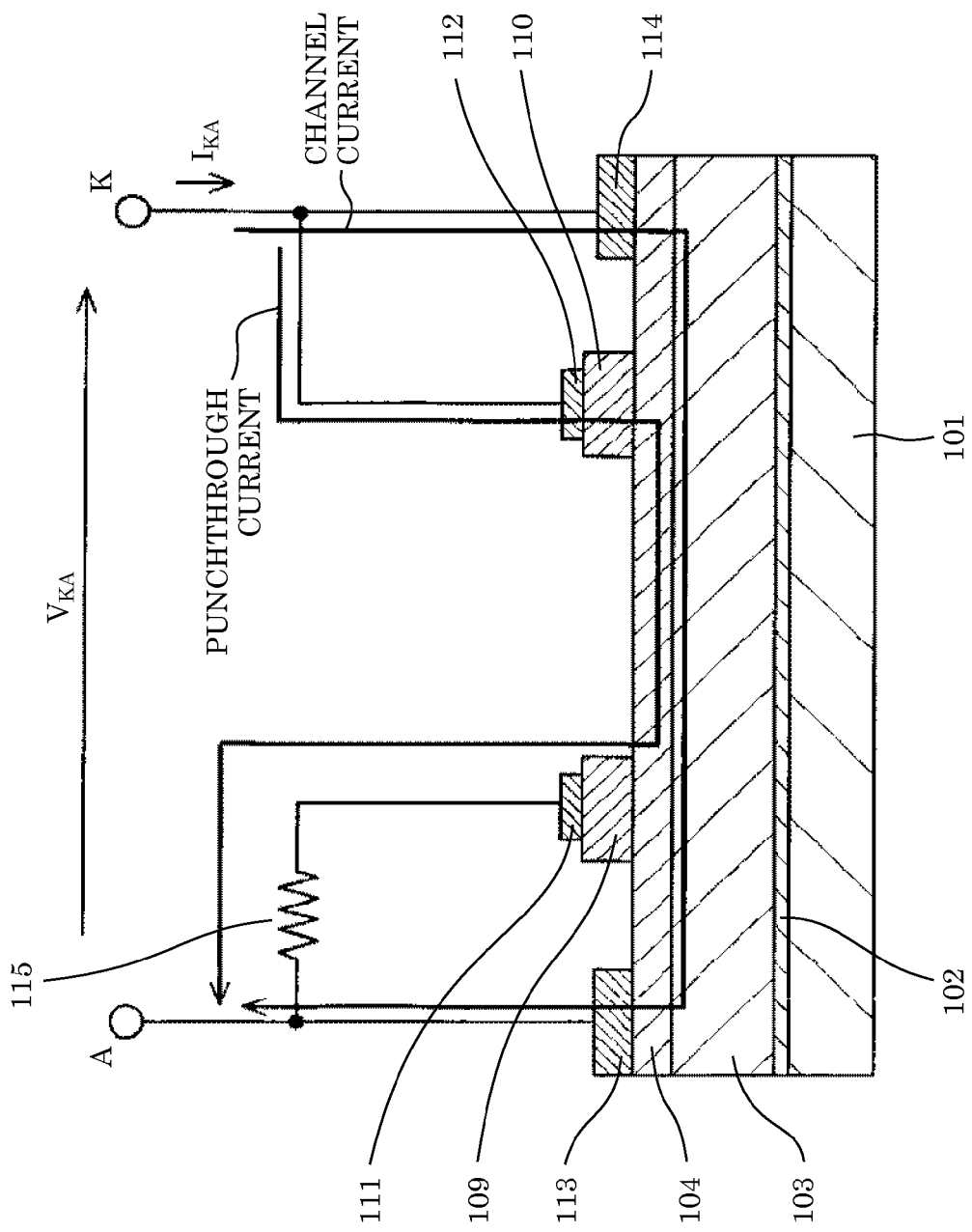
FIG. 3 is a cross-sectional view of a surge protection element according to Embodiment 2 of the present disclosure.

FIG. 3 is a cross-sectional view of a surge protection element according to Embodiment 2. Buffer layer 102, GaN layer 103, and AlGaN layer 104 are sequentially stacked on Si substrate 101 in this order. A two dimensional electron gas layer to serve as a channel is generated at the interface between AlGaN layer 104 and GaN layer 103. First ohmic electrode 113, first p-type GaN layer 109, second p-type GaN layer 110, and second ohmic electrode 114 each having a finger shape and extending in the direction perpendicular to the drawing sheet, are disposed on AlGaN layer 104. First p-type GaN layer 109 is disposed between first ohmic electrode 113 and second p-type GaN layer 110. Second p-type GaN layer 110 is disposed between first p-type GaN layer 109 and second ohmic electrode 114.

First ohmic electrode 113 and second ohmic electrode 114 each comprise, for example, titanium (Ti) and aluminum (Al). In Embodiment 2, Al is disposed on Ti. First ohmic electrode 113 and second ohmic electrode 114 each form an ohmic contact with a channel which is a two dimensional electron gas layer.

First electrode 111 is electrically connected to first ohmic electrode 113 via first resistance 115. Second electrode 112 is electrically connected to second ohmic electrode 114. A voltage applied between terminal K electrically connected to second ohmic electrode 114 and terminal A electrically connected to first ohmic electrode 113 is referred to $V_{KA}$. A current which flows from terminal K to terminal A is referred to $I_{KA}$.

Such a structure allows conduction of current larger than that conducted through the surge protection element according to Embodiment 1. Hereinafter, specific operations will be described.

The surge protection element according to Embodiment 2 can be considered as a transistor which includes first ohmic electrode 113 as a source, second ohmic electrode 114 as a drain, and first electrode 111 as a gate. Moreover, inclusion of first p-type GaN layer 109 between first electrode 111 and AlGaN layer 104 leads to a so-called normally-off transistor similarly to the transistor illustrated in FIG. 17. For example, the threshold voltage of the transistor can be set to 1 V.

A voltage is applied between first electrode 111 serving as a gate and first ohmic electrode 113 serving as a source via first resistance 115 such that the gate-source voltage is 0 V. For example, when voltage $V_{KA}$ is applied in such a state such that terminal K is positive and terminal A is negative, the transistor operates to interrupt current flowing from second ohmic electrode 114 to first ohmic electrode 113 because the gate is in an off state in the low voltage region.

On the other hand, when $V_{KA}$ is higher than or equal to the clamp voltage, in a similar manner to Embodiment 1, punchthrough current flows from terminal K to terminal A via second electrode 112 and first electrode 111. Here, punchthrough current also flows through first resistance 115, thereby generating voltage $\Delta V$ at first resistance 115. When voltage $\Delta V$ is higher than 1 V that is the threshold voltage, gate is turned on, causing channel current to flow from second ohmic electrode 114 to first ohmic electrode 113 via the channel. Since the channel current and the punchthrough current contribute to current $I_{KA}$ flowing between terminal K and terminal A, current larger than the current in Embodiment 1 can be conducted, allowing higher excess voltage to be absorbed.

Figure 4:
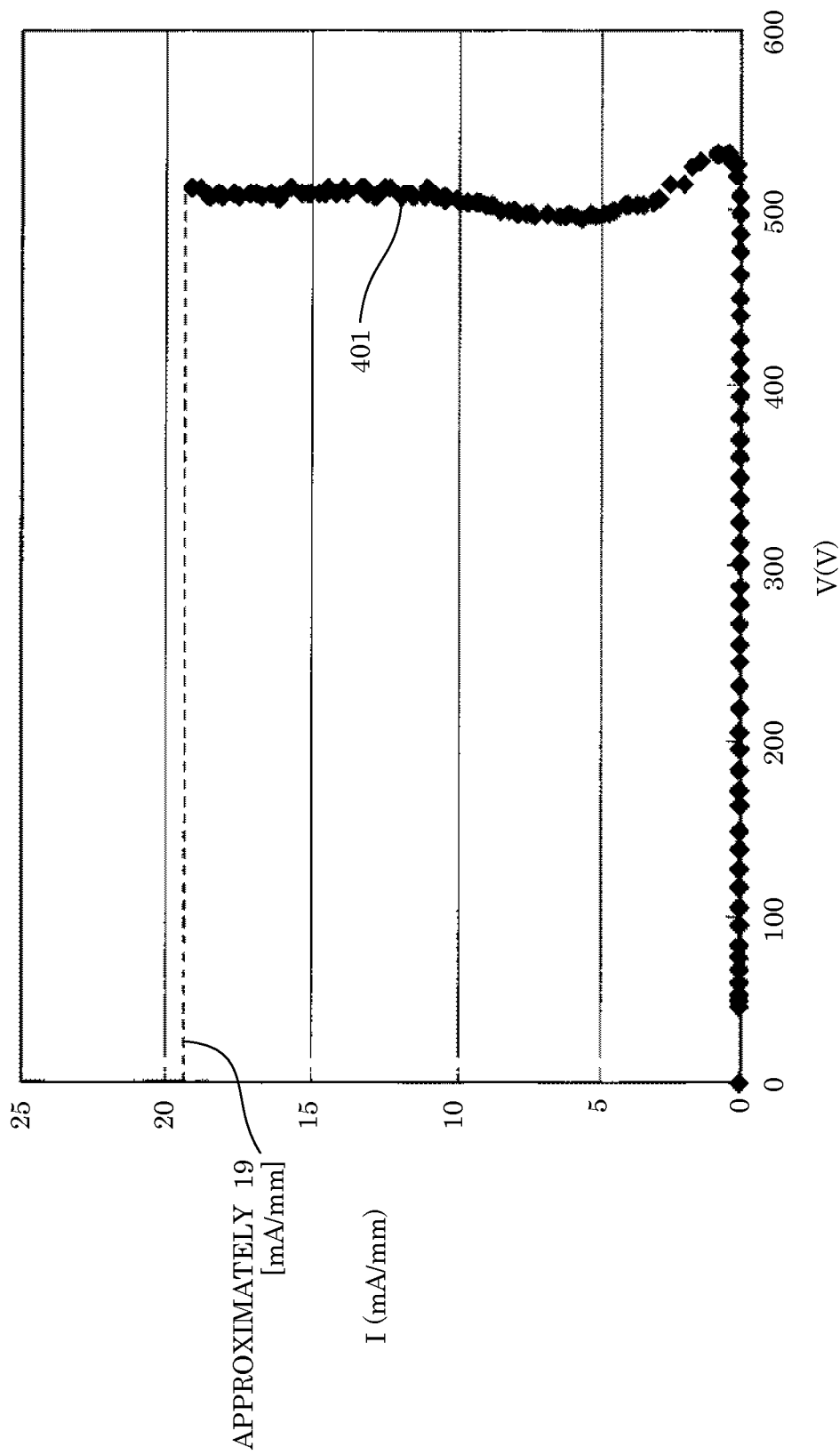
FIG. 4 illustrates current-voltage characteristics of the surge protection element according to Embodiment 2 of the present disclosure.

FIG. 4 illustrates current-voltage characteristics of the surge protection element according to Embodiment 2. The horizontal axis represents $V_{KA}$ [V], and the vertical axis represents $I_{KA}$ [mA/mm]. $I_{KA}$ indicates a current value obtained when each of first p-type GaN layer 109, second p-type GaN layer 110, first ohmic electrode 113, and second ohmic electrode 114, which has a finger shape and where current conducts, has a length of 1 mm in the longitudinal direction (direction perpendicular to the drawing sheet).

Characteristics 401 in FIG. 4 indicate current-voltage characteristics of the surge protection element according to Embodiment 2. As FIG. 4 illustrates, current of approximately 19 [mA/mm] can be conducted upon application of 500 V, allowing larger current to be conducted than the current conducted through the surge protection element according to Embodiment 1.

Embodiment 3

Figure 5:
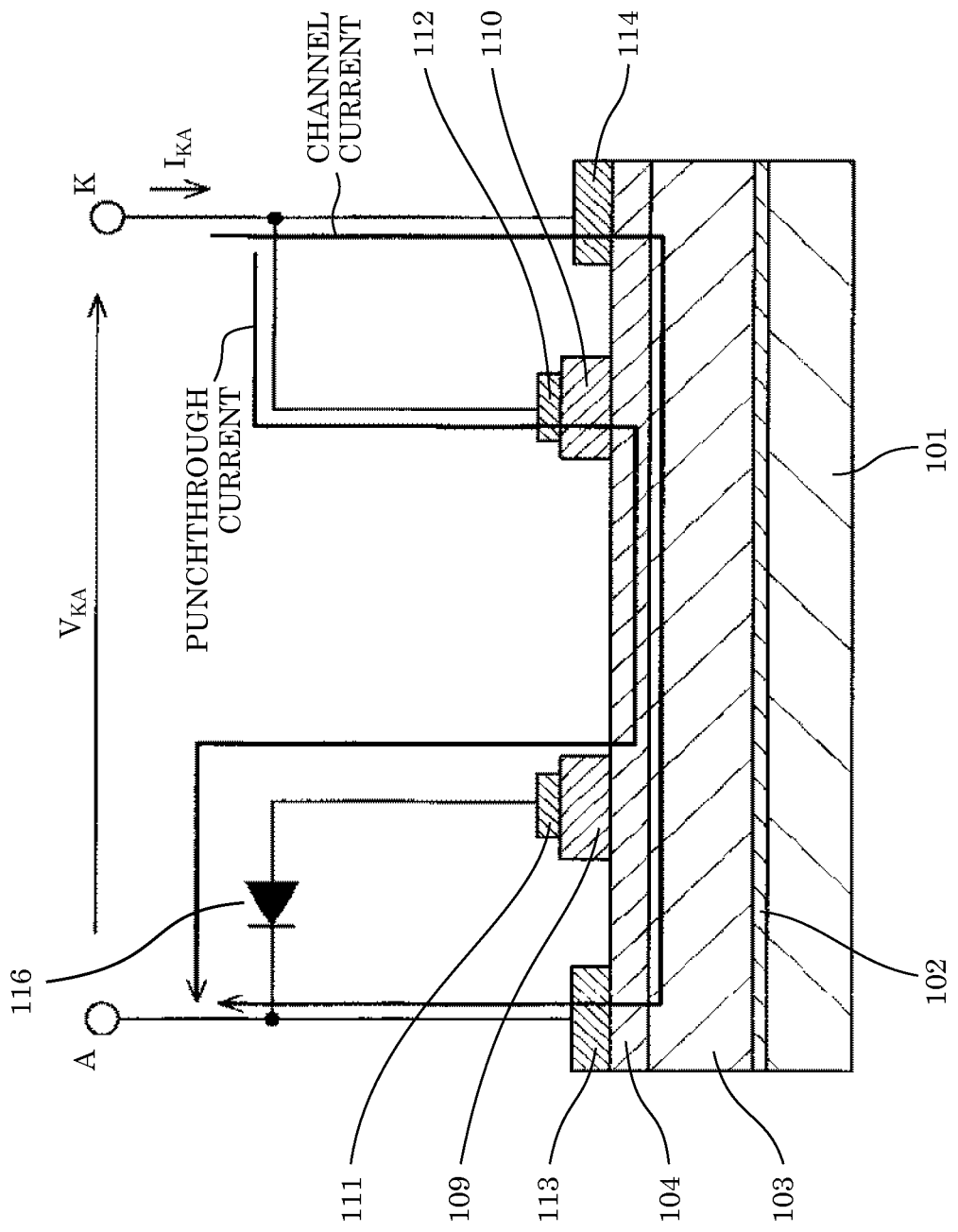
FIG. 5 is a cross-sectional view of a surge protection element according to Embodiment 3 of the present disclosure.

FIG. 5 is a cross-sectional view of a surge protection element according to Embodiment 3.

The surge protection element according to Embodiment 3 is different from the surge protection element according to Embodiment 2 mainly in that first electrode 111 is electrically connected to first ohmic electrode 113 via first diode 116 instead of first resistance 115. The cathode of first diode 116 is first ohmic electrode 113, and the anode of first diode 116 is first electrode 111. The turn-on voltage of first diode 116 is preferably 2 to 3 V approximately when punchthrough current flows. First diode 116 may include, for example, a series connection of a schottky barrier diode and a PN junction diode each comprising silicon, or a PN junction diode comprising GaN.

Such a structure allows the surge protection element according to Embodiment 3 to conduct current as large as that conducted through the surge protection element according to Embodiment 2.

In the surge protection element according to Embodiment 2, when punchthrough current varies due to process variation, for example, voltage ΔV generated at first resistance 115 reflects the variation, resulting in unstable current conduction characteristics. On the other hand, in the surge protection element according to Embodiment 3, variation in voltage generated at first diode 116 can be suppressed due to its diode characteristics even if punchthrough current varies. Hence, the variations in current characteristics of the surge protection element due to process variation can be suppressed, leading to reliable current conduction between first ohmic electrode 113 and second ohmic electrode 114. As a result, excess voltage can be absorbed.

Additionally, since a PN junction diode can be used which comprises GaN, a p-type GaN layer which is formed at the same time of manufacturing the surge protection element according to Embodiment 3 can be used. Accordingly, a process for forming a resistance is unnecessary, which requires less manufacturing processes than those required for the surge protection element according to Embodiment 2.

Embodiment 4

Figure 6:
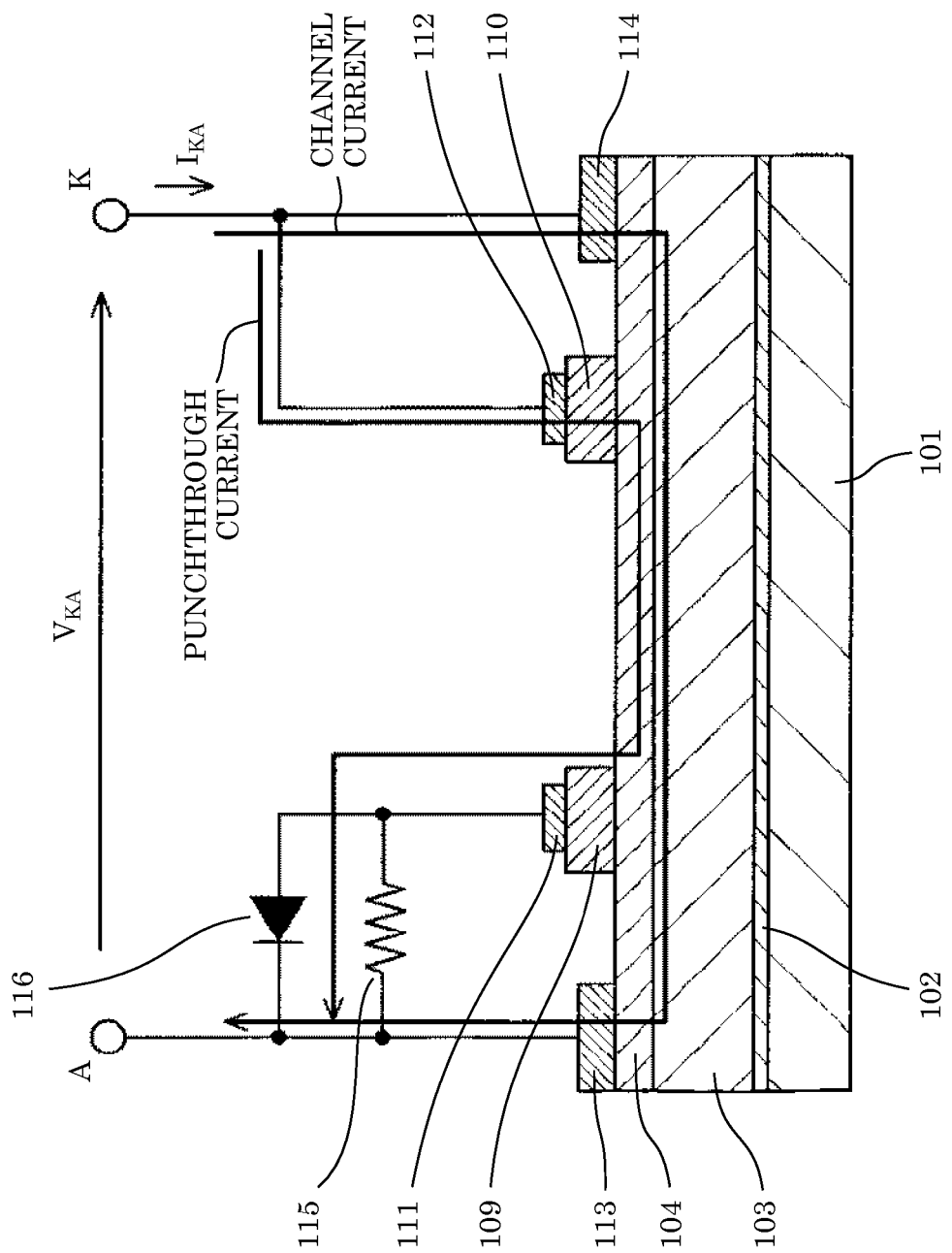
FIG. 6 is a cross-sectional view of a surge protection element according to Embodiment 4 of the present disclosure.

FIG. 6 is a cross-sectional view of a surge protection element according to Embodiment 4.

The surge protection element according to Embodiment 4 has a structure in which first electrode 111 is electrically connected to first ohmic electrode 113 via first diode 116 and first resistance 115, and first diode 116 is connected in parallel with first resistance 115.

Such a structure provides a surge protection element which operates more stably than the surge protection element according to Embodiment 3. In other words, inclusion of first resistance 115 achieves an off state of a transistor including second ohmic electrode 114 as a drain, first electrode 111 as a gate, and first ohmic electrode 113 as a source, at lower impedance connection. This fixes the potential of first p-type GaN layer 109.

In Embodiment 3, the potential of first p-type GaN layer 109 at high impedance connection is, for example, 0 V. Here, entrance of noise from outside generates electric charges in first p-type GaN layer 109. When the potential of first p-type GaN layer 109 is increased by the generated charges, the gate is incorrectly turns on, conducting current through the channel. This results in an incorrect operation of the surge protection element. In Embodiment 4, the gate is turned off in a state where first resistance 115 is connected and at a lower impedance connection than when first diode 116 is connected. This improves resistance of noise from outside, allowing the surge protection element according to Embodiment 4 to operate more stably. As a result, it is possible to more reliably interrupt leak current even under application of a high voltage to the surge protection element.

Embodiment 5

Figure 7:
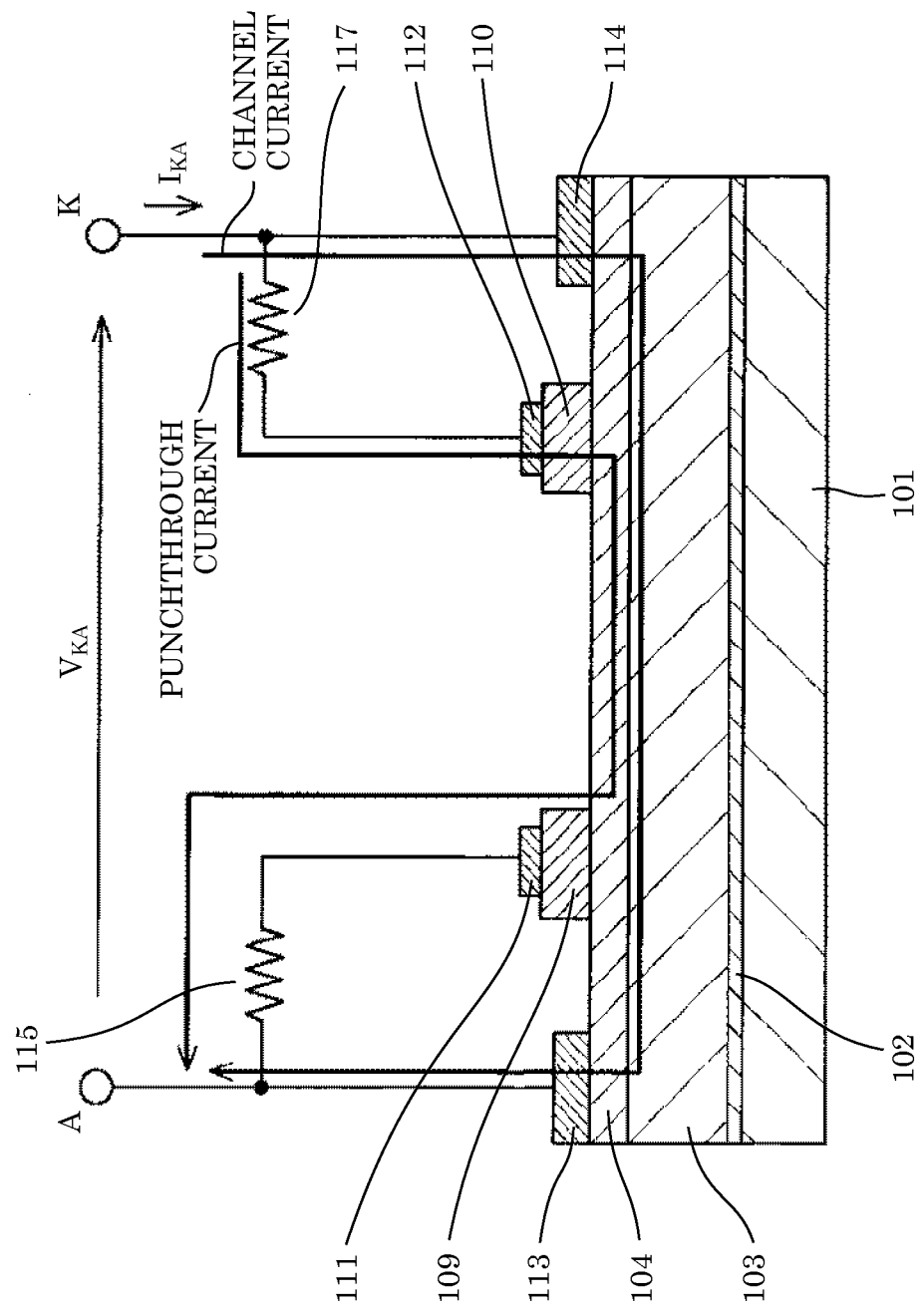
FIG. 7 is a cross-sectional view of a surge protection element according to Embodiment 5 of the present disclosure.

FIG. 7 is a cross-sectional view of a surge protection element according to Embodiment 5.

In the surge protection element according to Embodiment 5, first electrode 111 is electrically connected to first ohmic electrode 113 via first resistance 115, and second electrode 112 is electrically connected to second ohmic electrode 114 via second resistance 117.

Such a structure allows the surge protection element according to Embodiment 5 to conduct current as large as that conducted through the surge protection element according to Embodiment 2. In addition, the symmetric structure allows the surge protection element to have both positive and negative clamp voltages and conduct current. Accordingly, even at application of either positive or negative excessive voltage, such excessive voltage can be absorbed. By connecting the surge protection element according to Embodiment 5 and a bidirectional switch which withstands both positive and negative voltages, the avalanche resistance for positive and negative voltages can be substantially and significantly increased.

Embodiment 6

Figure 8:
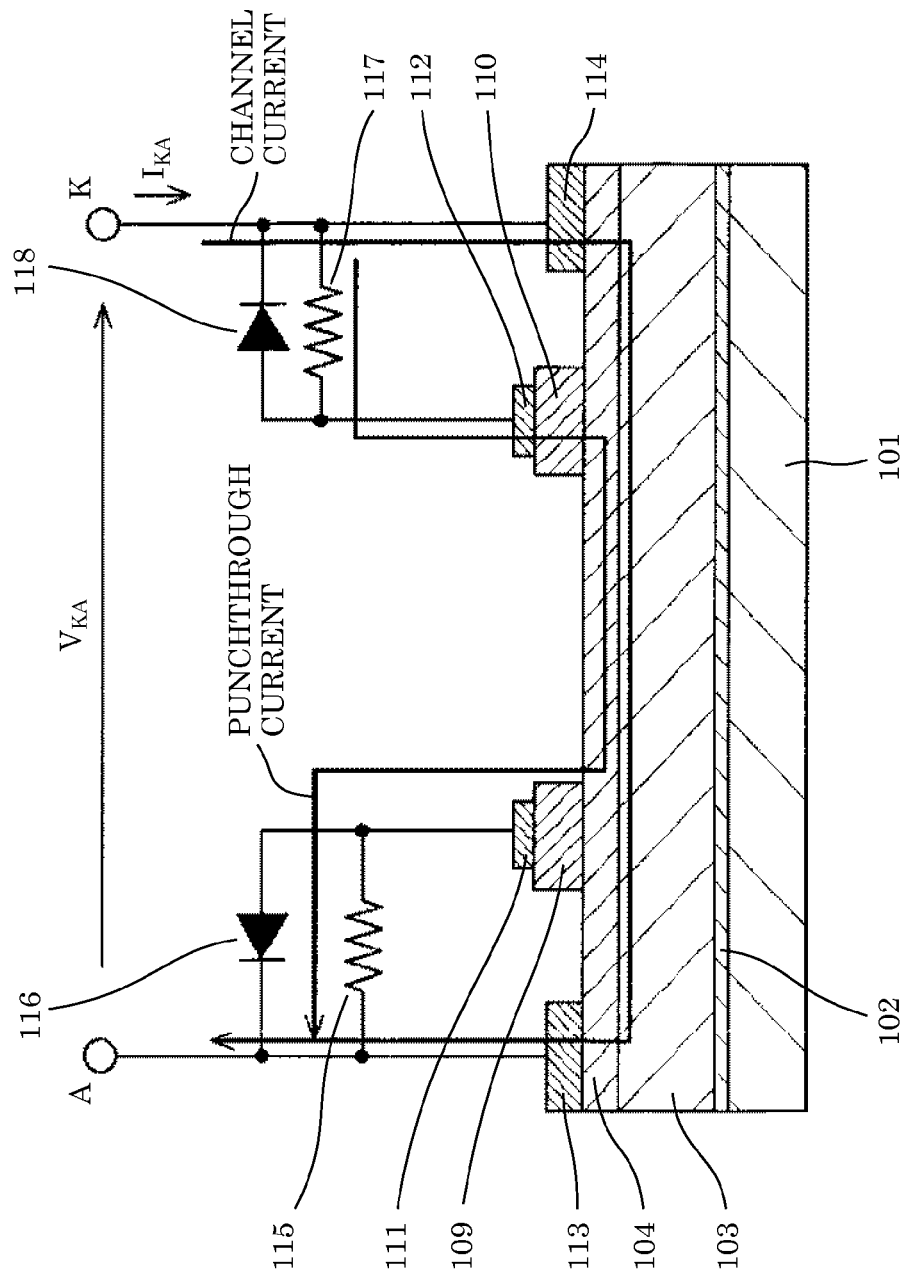
FIG. 8 is a cross-sectional view of a surge protection element according to Embodiment 6 of the present disclosure.

FIG. 8 is a cross-sectional view of a surge protection element according to Embodiment 6.

In the surge protection element according to Embodiment 6, first electrode 111 is electrically connected to first ohmic electrode 113 via first diode 116 and first resistance 115. First diode 116 is connected in parallel with first resistance 115. Second electrode 112 is electrically connected to second ohmic electrode 114 via second diode 118 and second resistance 117. Second diode 118 is connected in parallel with second resistance 117. The anode of second diode 118 is connected to second electrode 112, and the cathode of second diode 118 is connected to second ohmic electrode 114.

Such a structure allows the surge protection element according to Embodiment 6 to conduct current as large as that conducted through the surge protection element according to Embodiment 4. In addition, the symmetric structure allows the surge protection element to have both positive and negative clamp voltages, and to conduct current. Accordingly, even at application of either positive or negative voltage, such excessive voltage can be absorbed. By connecting the surge protection element according to Embodiment 6 and a bidirectional switch which withstands both positive and negative voltages, the avalanche resistance for positive and negative voltages can be substantially and significantly increased.

Embodiment 7

Figure 9:
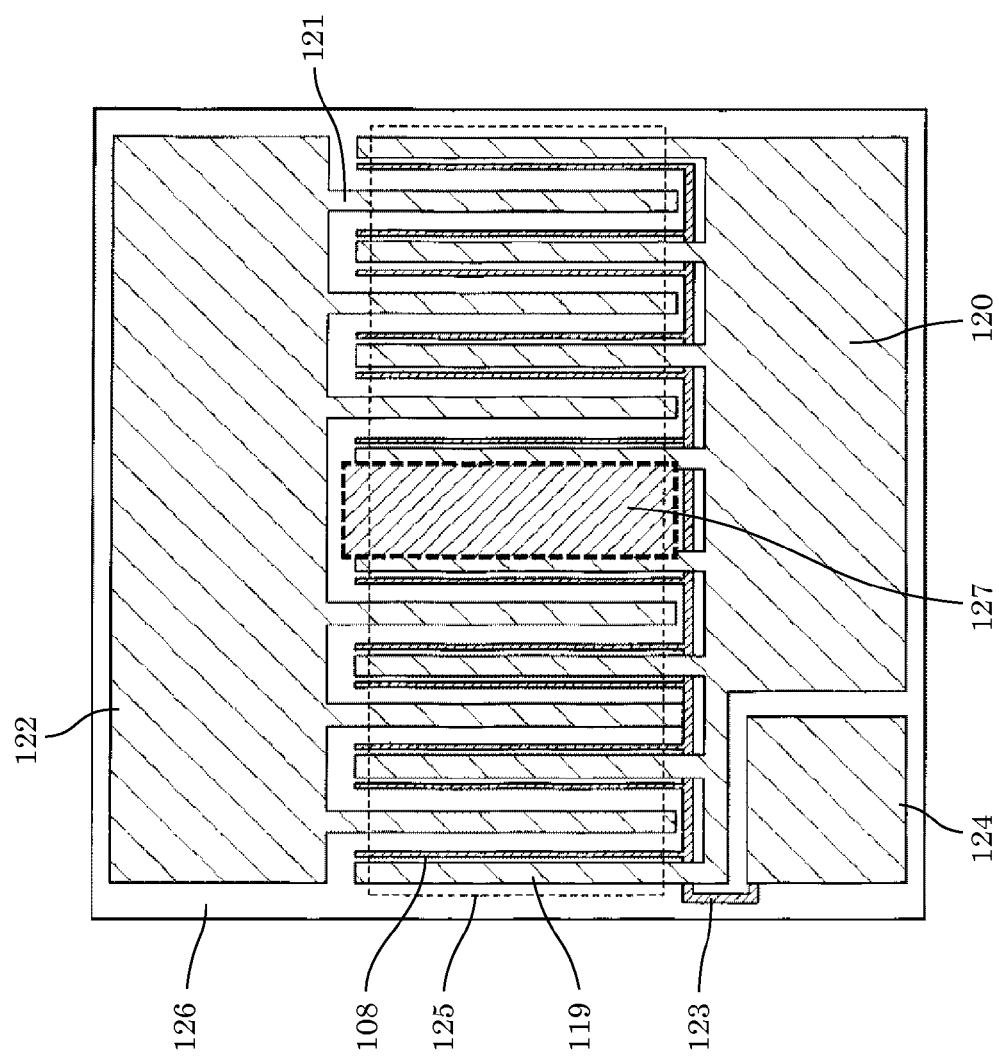
FIG. 9 is a plan view of a semiconductor device according to Embodiments 7 to 9 of the present disclosure.
Figure 10:
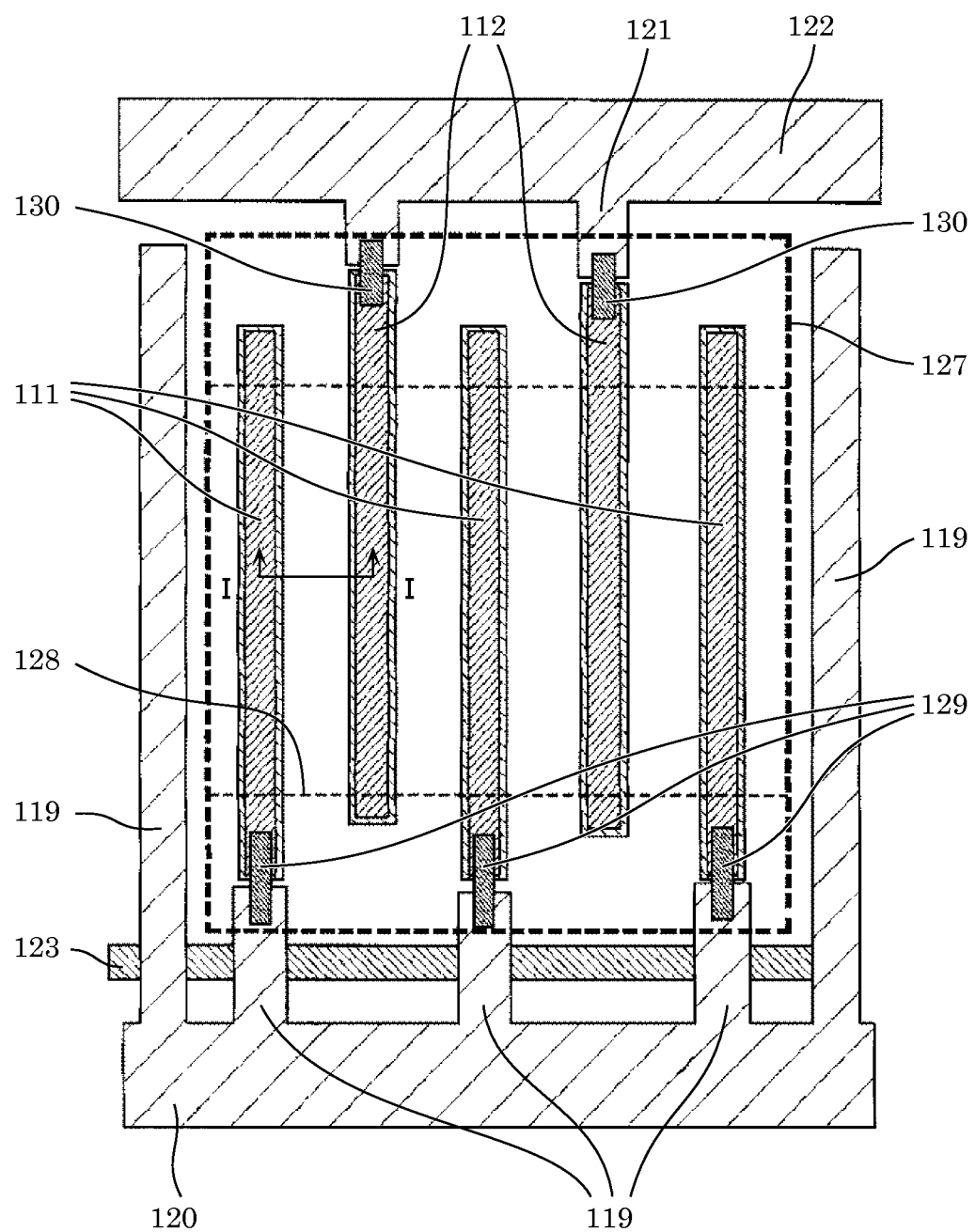
FIG. 10 is a plan view of a surge protection element according to Embodiment 7 of the present disclosure.

Referring to FIG. 9 and FIG. 10, a description will be given of a structure of a semiconductor device according to Embodiment 7 in which a surge protection element and a GaN-based transistor are integrated.

FIG. 9 illustrates a layout of a semiconductor device according to Embodiment 7. An example of a GaN-based transistor integrated is illustrated in FIG. 17.

FIG. 9 will be commonly used in describing Embodiments 7, 8, and 9.

The semiconductor device according to Embodiment 7 includes, in addition to the structure of the GaN-based transistor illustrated in FIG. 17: finger-shaped source electrode line 119 disposed on source electrode 105 and electrically connected to source electrode 105; source electrode pad 120 electrically connected to source electrode line 119; finger-shaped drain electrode line 121 electrically connected to drain electrode 106; drain electrode pad 122 electrically connected to drain electrode line 121; gate electrode line 123 electrically connected to finger-shaped gate electrode 108; and gate electrode pad 124 electrically connected to gate electrode line 123.

Source electrode line 119, source electrode pad 120, drain electrode line 121, drain electrode pad 122, and gate electrode pad 124 each comprise, for example, Ti and Au. Gate electrode line 123 comprises, for example, Pd and Au similarly to gate electrode 108.

The inside of the larger dashed rectangle region in FIG. 9 is active region 125, and the outside of the region is inactive region 126. Inactive region 126 has a high resistance because, for example, iron (Fe) has been injected from the surface of AlGaN layer 104 into approximately 300 nm depth; and thus, no current flows through inactive region 126. Surge protection element region 127 is disposed where surge protection elements are arranged so as to include at least a portion of active region 125. Surge protection element region 127 is disposed in, for example, almost the central part of the transistor according to Embodiment 7 in a plan view.

FIG. 10 illustrates a layout of the surge protection elements according to Embodiment 7. The detailed illustration of surge protection element region 127 illustrated in FIG. 9 corresponds to surge protection element region 127 illustrated in FIG. 10. The surge protection elements formed in surge protection element region 127 each have the structure according to Embodiment 1. The cross-sectional view of the surge protection element according to Embodiment 1 illustrated in FIG. 1 corresponds to the cross-sectional view taken along line I-I in FIG. 10.

Surge protection element region 127 includes a plurality of finger-shaped first electrodes 111 and a plurality of finger-shaped second electrodes 112. First electrodes 111 and second electrodes 112 are alternately disposed.

First electrodes 111 and source electrode lines 119 are electrically connected by first connection lines 129. Second electrodes 112 and drain electrode lines 121 are electrically connected by second connection lines 130.

In other words, source electrode 105 is electrically connected to first electrode 111 of the surge protection element, and drain electrode 106 is electrically connected to second electrode 112 of the surge protection element.

In the case where first electrode 111 is directly connected to source electrode line 119, first connection line 129 is unnecessary. In the case where second electrode 112 is directly connected to drain electrode line 121, second connection line 130 is unnecessary.

Active region 128 of the surge protection element is a portion of active region 125 illustrated in FIG. 9.

According to Embodiment 7, the GaN-based transistor and the surge protection element according to Embodiment 1 can be integrated on the same substrate, thereby providing a semiconductor device having a substantially increased avalanche resistance. Moreover, an additional process for forming a diode on an Si substrate as disclosed in PTL 2 is unnecessary, leading to a reduced number of processes and a reduced cost.

Embodiment 8

Referring to FIG. 9, FIG. 11, FIG. 12A, FIG. 12B, and FIG. 12C, a description will be given of a structure of a semiconductor device according to Embodiment 8 in which a surge protection element and a GaN-based transistor are integrated.

Figure 11:
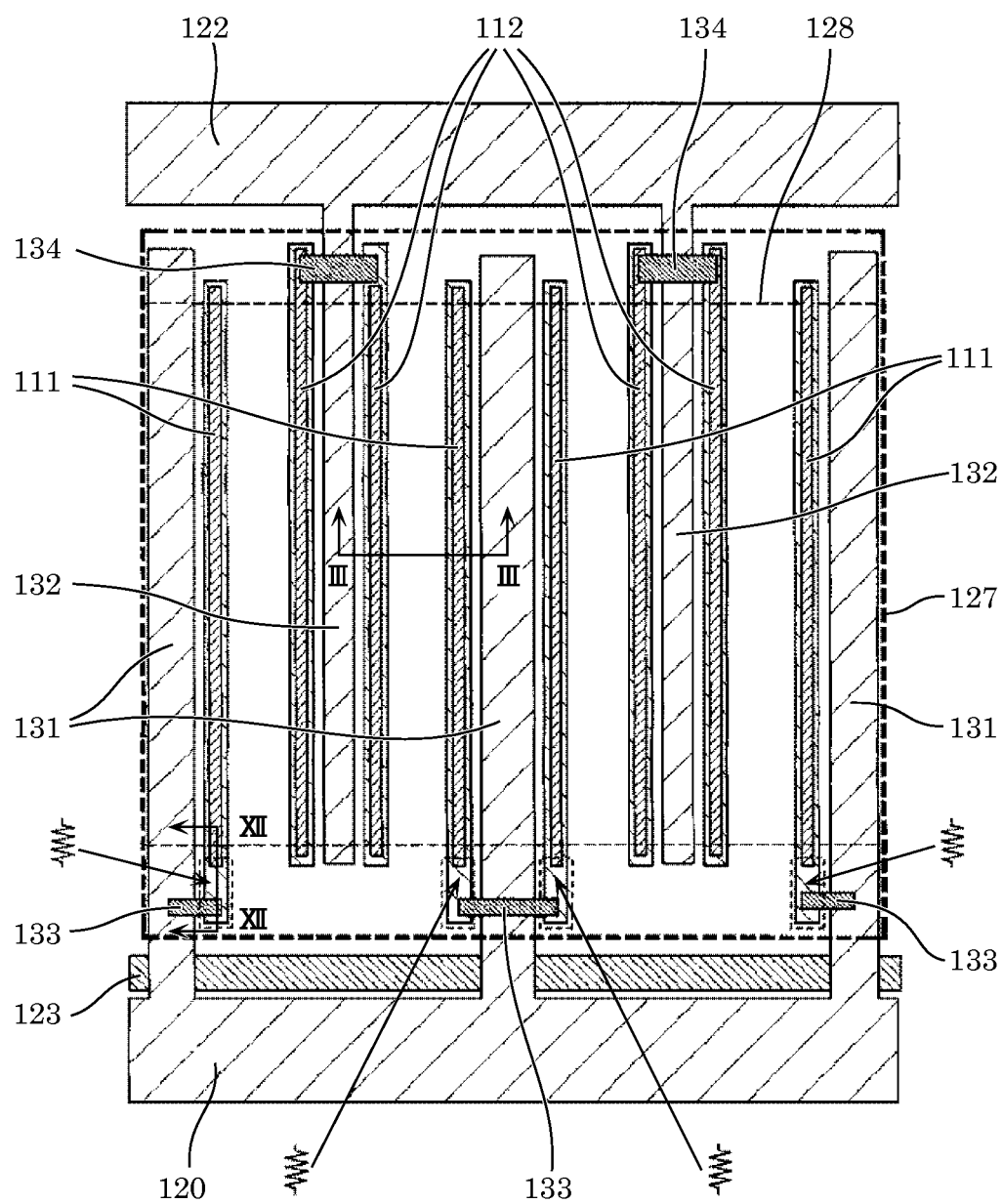
FIG. 11 is a plan view of a surge protection element according to Embodiment 8 of the present disclosure.

FIG. 11 illustrates a layout of the surge protection element according to Embodiment 8. Surge protection element region 127 illustrated in FIG. 9 corresponds to surge protection element region 127 illustrated in FIG. 11. The structure of the surge protection element formed in surge protection element region 127 is the same as the structure according to Embodiment 2. The cross-sectional of the surge protection element illustrated in FIG. 3 corresponds to the cross-section taken along line III-III in FIG. 11.

Assuming that the finger-shaped surge protection element according to Embodiment 2 is one cell, surge protection element region 127 includes a plurality of cells. The surge protection element according to Embodiment 8 includes, in addition to the surge protection element according to Embodiment 2; first ohmic electrode line 131 disposed on first ohmic electrode 113 and electrically connected to first ohmic electrode 113; and second ohmic electrode line 132 disposed on second ohmic electrode 114 and electrically connected to second ohmic electrode 114.

First ohmic electrode line 131 and second ohmic electrode line 132 each comprise, for example, Au and Ti. First ohmic electrode line 131 is electrically connected to source electrode pad 120. Second ohmic electrode line 132 is electrically connected to drain electrode pad 122. First electrode 111 is electrically connected to first ohmic electrode line 131 via third connection line 133. Second electrode 112 is electrically connected to second ohmic electrode line 132 via fourth connection line 134.

In other words, source electrode 105 is electrically connected to first ohmic electrode 113 of the surge protection element, and drain electrode 106 is electrically connected to second ohmic electrode 114 of the surge protection element.

Figure 12A:
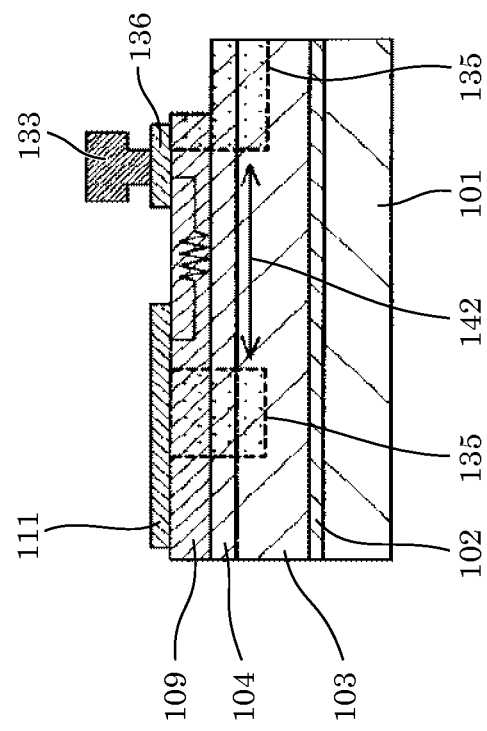
FIG. 12A is a cross-sectional view of an example of a resistance portion of the surge protection element according to Embodiment 8 of the present disclosure.
Figure 12B:
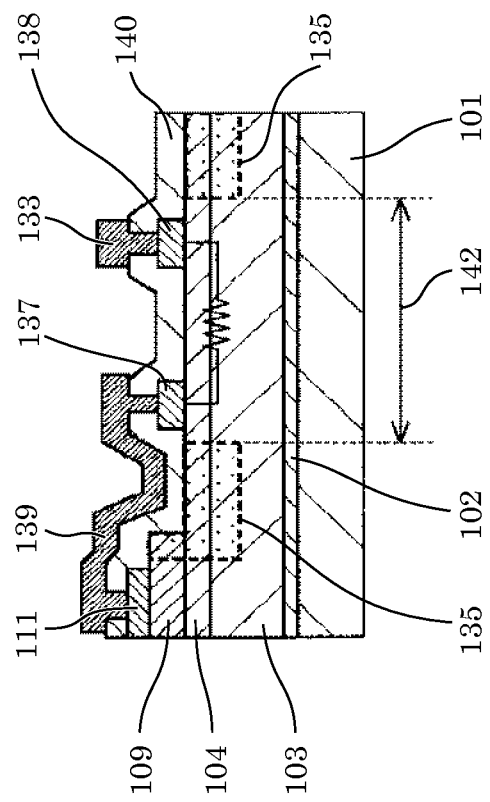
FIG. 12B is a cross-sectional view of another example of the resistance portion of the surge protection element according to Embodiment 8 of the present disclosure.
Figure 12C:
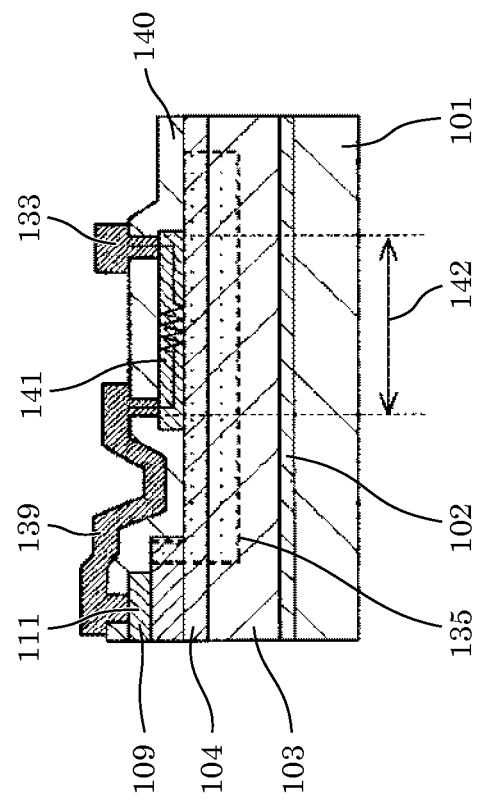
FIG. 12C is a cross-sectional view of another example of the resistance portion of the surge protection element according to Embodiment 8 of the present disclosure.

FIG. 12A, FIG. 12B, and FIG. 12C each illustrate a cross-section taken along line XII-XII in FIG. 11, and illustrate an example of the finger tip portion of first p-type GaN layer 109. First p-type GaN layer 109 includes inactive region 135 having a resistance increased by injection of ion such as Fe. The depth of inactive region 135 reaches a portion of GaN layer 103.

In the example illustrated in FIG. 12A, first electrode 111, and third electrode 136 are disposed on first p-type GaN layer 109 in resistance region 142 surrounded by inactive region 135. Third electrode 136 comprises, for example, the same material as that of first electrode 111. Each of first electrode 111 and third electrode 136 forms an ohmic contact with first p-type GaN layer 109 in resistance region 142. Such a structure allows first resistance 115 of the surge protection element according to Embodiment 2 to be formed by first p-type GaN layer 109. This eliminates the need for manufacturing the resistance in an extra process, which simplifies the manufacturing processes.

Third electrode 136 is electrically connected to first ohmic electrode line 131 via third connection line 133. In the case where third electrode 136 is directly connected to first ohmic electrode line 131, first connection line 129 is unnecessary. In the case where second electrode 112 is directly connected to second ohmic electrode line 132, second connection line 130 is unnecessary.

In the example illustrated in FIG. 12B, fourth electrode 137 and fifth electrode 138 are disposed on AlGaN layer 104 in resistance region 142 surrounded by inactive region 135. First electrode 111 is electrically connected to fourth electrode 137 via fifth connection line 139. Such a structure allows first resistance 115 of the surge protection element according to Embodiment 2 to be formed by AlGaN layer 104 and GaN layer 103. This eliminates the need for manufacturing the resistance in an extra process, which simplifies the manufacturing processes.

Fifth electrode 138 is electrically connected to first ohmic electrode line 131 via third connection line 133. Fourth electrode 137 and fifth electrode 138 each comprise, for example, Au and Ti, similarly to first ohmic electrode line 131. Protective film 140 is disposed on AlGaN layer 104, fourth electrode 137, fifth electrode 138, first p-type GaN layer 109, and first electrode 111.

In the example illustrated in FIG. 12C, sixth electrode 141 is disposed on AlGaN layer 104 in resistance region 142. First electrode 111 is electrically connected to sixth electrode 141 via fifth connection line 139. Such a structure allows first resistance 115 of the surge protection element according to Embodiment 2 to be formed by sixth electrode 141, allowing a lower resistance value to be set. This increases design flexibility of the semiconductor device.

Sixth electrode 141 is electrically connected to first ohmic electrode line 131 via third connection line 133. Sixth electrode 141 comprises, for example, Pd and Au, similarly to first electrode 111. Protective film 140 is disposed on AlGaN layer 104, sixth electrode 141, first p-type GaN layer 109, and first electrode 111.

According to Embodiment 8, a GaN transistor and the surge protection element according to Embodiment 2 can be integrated on the same substrate, providing a GaN transistor which has a substantially increased avalanche resistance. Moreover, an additional process for forming a diode on an Si substrate as disclosed in PTL 2 is unnecessary, leading to a reduced number of processes and a reduced cost.

In the case where the surge protection element according to Embodiment 5 and a GaN-based transistor are integrated, second ohmic electrode line 132 may be electrically connected to second electrode 112 in a similar manner to first ohmic electrode line 131 and first electrode 111.

Embodiment 9

Referring to FIG. 9, FIG. 13, FIG. 14A and FIG. 14B, a description will be given of a structure of a semiconductor device according to Embodiment 9 in which a surge protection element and a GaN-based transistor are integrated.

Figure 13:
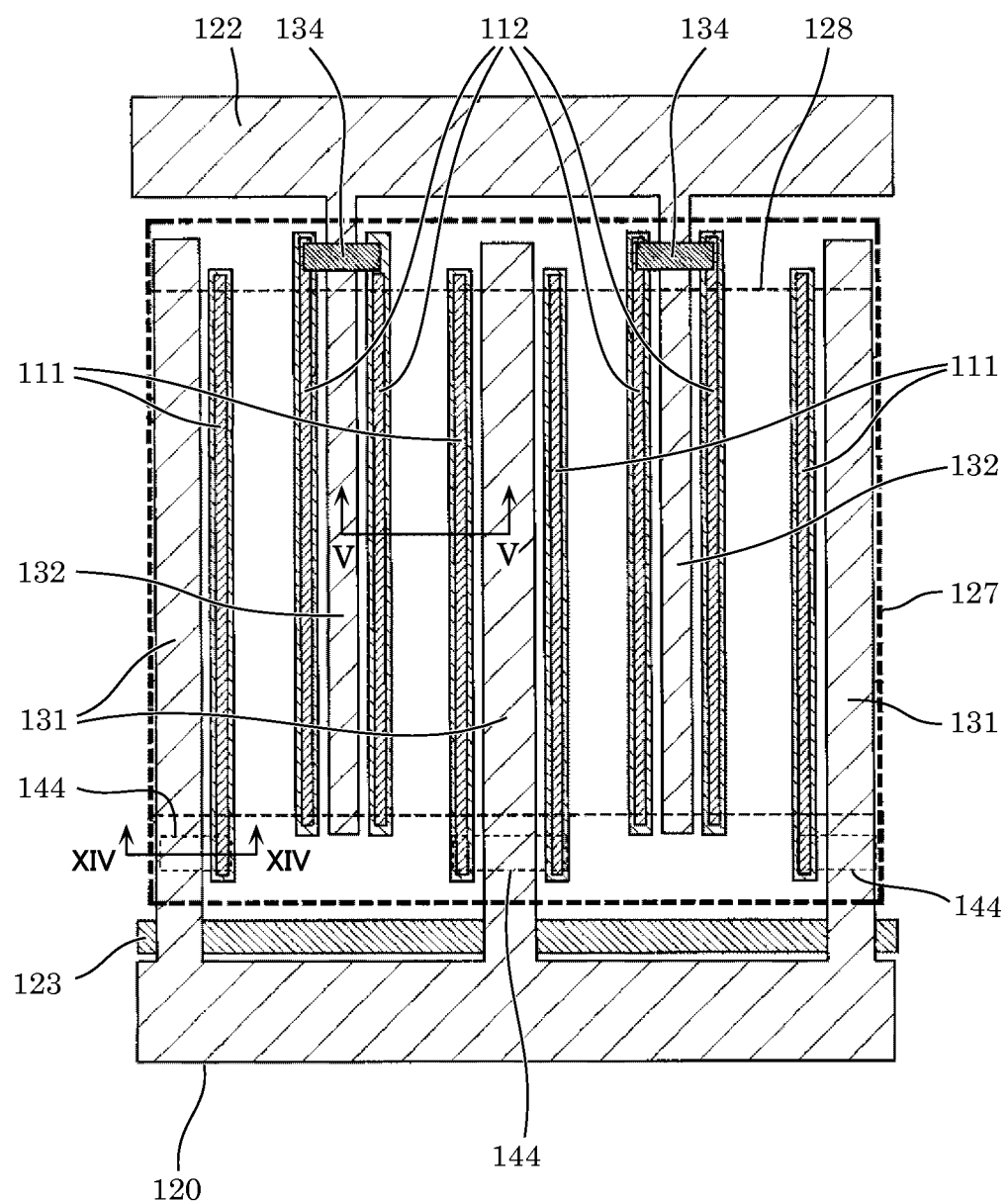
FIG. 13 is a plan view of a surge protection element according to Embodiment 9 of the present disclosure.

FIG. 13 illustrates a layout of surge protection elements according to Embodiment 9. Surge protection element region 127 illustrated in FIG. 9 corresponds to surge protection element region 127 illustrated in FIG. 13. The structure of each surge protection element formed in surge protection element region 127 is the same as the structure according to Embodiment 3. The cross-sectional view of the surge protection element illustrated in FIG. 5 corresponds to the cross-section taken along line V-V in FIG. 13.

Assuming that the finger-shaped surge protection element according to Embodiment 3 is one cell, surge protection element region 127 includes a plurality of cells. The surge protection element according to Embodiment 9 includes, in addition to the surge protection element according to Embodiment 3; first ohmic electrode line 131 disposed on first ohmic electrode 113 and electrically connected to first ohmic electrode 113; and second ohmic electrode line 132 disposed on second ohmic electrode 114 and electrically connected to second ohmic electrode 114.

First ohmic electrode line 131 and second ohmic electrode line 132 each comprise, for example, Au and Ti. First ohmic electrode line 131 is electrically connected to source electrode pad 120. Second ohmic electrode line 132 is electrically connected to drain electrode pad 122. Second electrode 112 is electrically connected to second ohmic electrode line 132 via fourth connection line 134. In the case where second electrode 112 and second ohmic electrode line 132 are directly connected, fourth connection line 134 is unnecessary.

In other words, source electrode 105 is electrically connected to first ohmic electrode 113 of the surge protection element, and drain electrode 106 is electrically connected to second ohmic electrode 114 of the surge protection element.

Figure 14A:
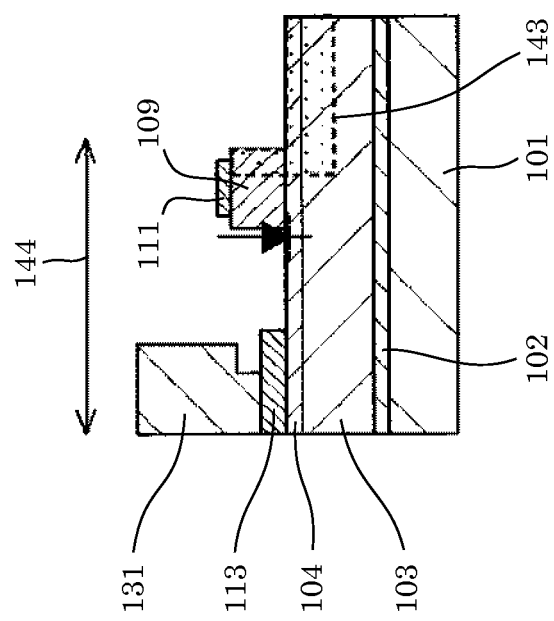
FIG. 14A is a cross-sectional view of an example of a diode portion of the surge protection element according to Embodiment 9 of the present disclosure.
Figure 14B:
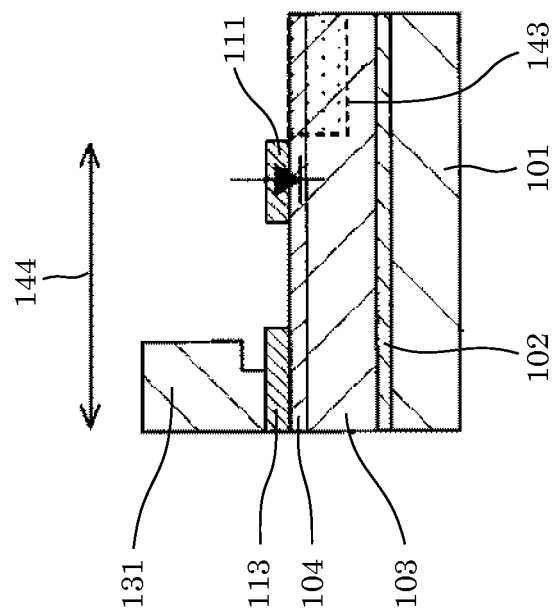
FIG. 14B is a cross-sectional view of another example of the diode portion of the surge protection element according to Embodiment 9 of the present disclosure.

FIG. 14A and FIG. 14B each illustrate a cross-section taken along line XIV-XIV in FIG. 13, and illustrate an example of a cross-section of diode region 144 illustrated in FIG. 13. A portion of first p-type GaN layer 109, a portion of AlGaN layer 104, and a portion of GaN layer 103 form inactive region 143 which has a resistance increased by injection of ion such as Fe. The depth of inactive region 143 reaches a portion of GaN layer 103.

In the example illustrated in FIG. 14A, a portion of first electrode 111 is disposed on first p-type GaN layer 109 in diode region 144 other than inactive region 143. The portion of first electrode 111 forms an ohmic contact with first p-type GaN layer 109 in diode region 144.

Such a structure allows formation of a diode including first ohmic electrode 111 as an anode and first ohmic electrode 113 as a cathode in diode region 144. This eliminates the need for manufacturing the diode in an extra process, which simplifies the manufacturing processes. The diode corresponds to first diode 116 of the surge protection element according to Embodiment 3.

In the example illustrated in FIG. 14B, a portion of first electrode 111 is disposed on AlGaN layer 104 in diode region 144 other than inactive region 143 without intervention of first p-type GaN layer 109. As a result, a schottky junction is formed.

Such a structure allows formation of a diode including first electrode 111 as an anode and first ohmic electrode 113 as a cathode in diode region 144. Moreover, design flexibility of the semiconductor device can be increased by disposing, between first electrode 111 and AlGaN layer 104, an electrode material to serve as a diode having a desired offset value. The diode corresponds to first diode 116 of the surge protection element according to Embodiment 3.

According to Embodiment 9, a GaN transistor and the surge protection element according to Embodiment 3 can be integrated on the same substrate, providing a GaN transistor which has a substantially increased avalanche resistance. Moreover, an additional process for forming the diode on an Si substrate as disclosed in PTL 2 is unnecessary, leading to a reduced number of processes and a reduced cost.

In the case where the surge protection element according to Embodiment 4 and a GaN-based transistor are integrated, the structure of the surge protection element according to Embodiment 8 and the structure of the surge protection element according to Embodiment 9 may be formed on the same substrate.

In the case where the surge protection element according to Embodiment 6 and a GaN-based transistor are integrated, second ohmic electrode line 132 may be electrically connected to second electrode 112 in a similar manner to first ohmic electrode line 131 and first electrode 111 according to Embodiment 8 and Embodiment 9.

Embodiment 10

Figure 15:
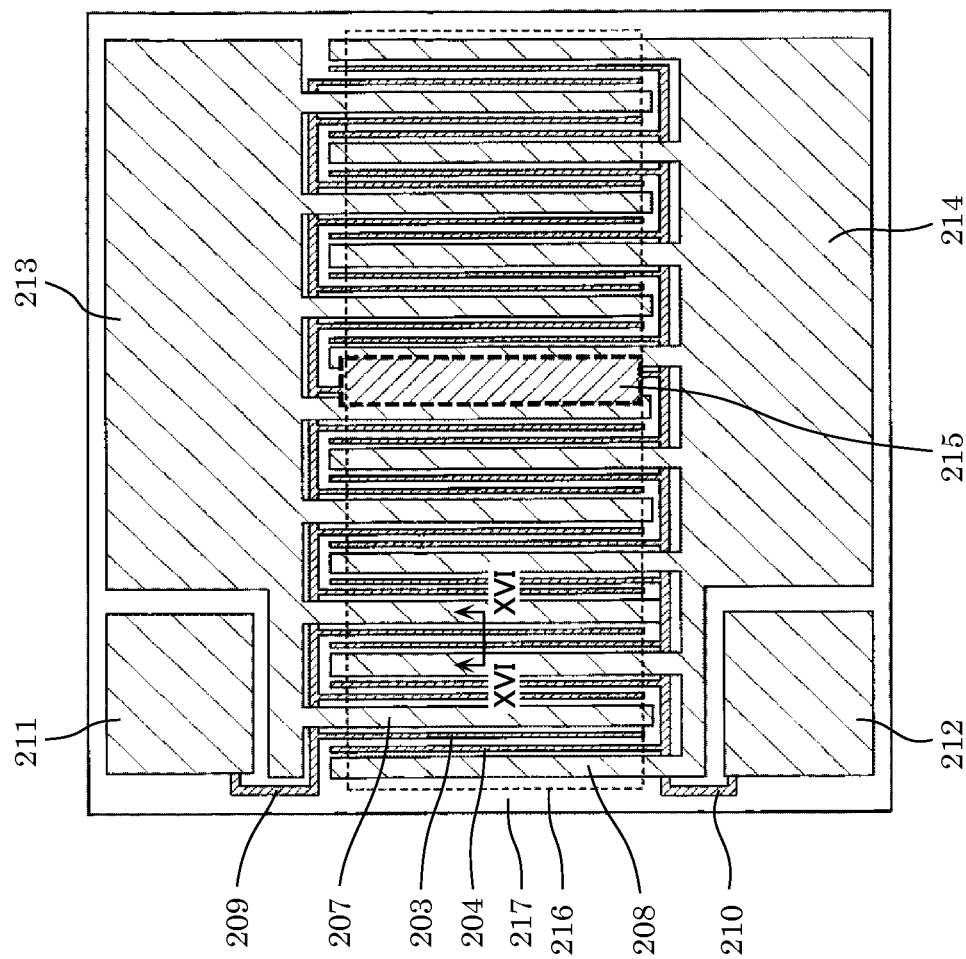
FIG. 15 is a plan view of a semiconductor device according to Embodiment 10 of the present disclosure.
Figure 16:
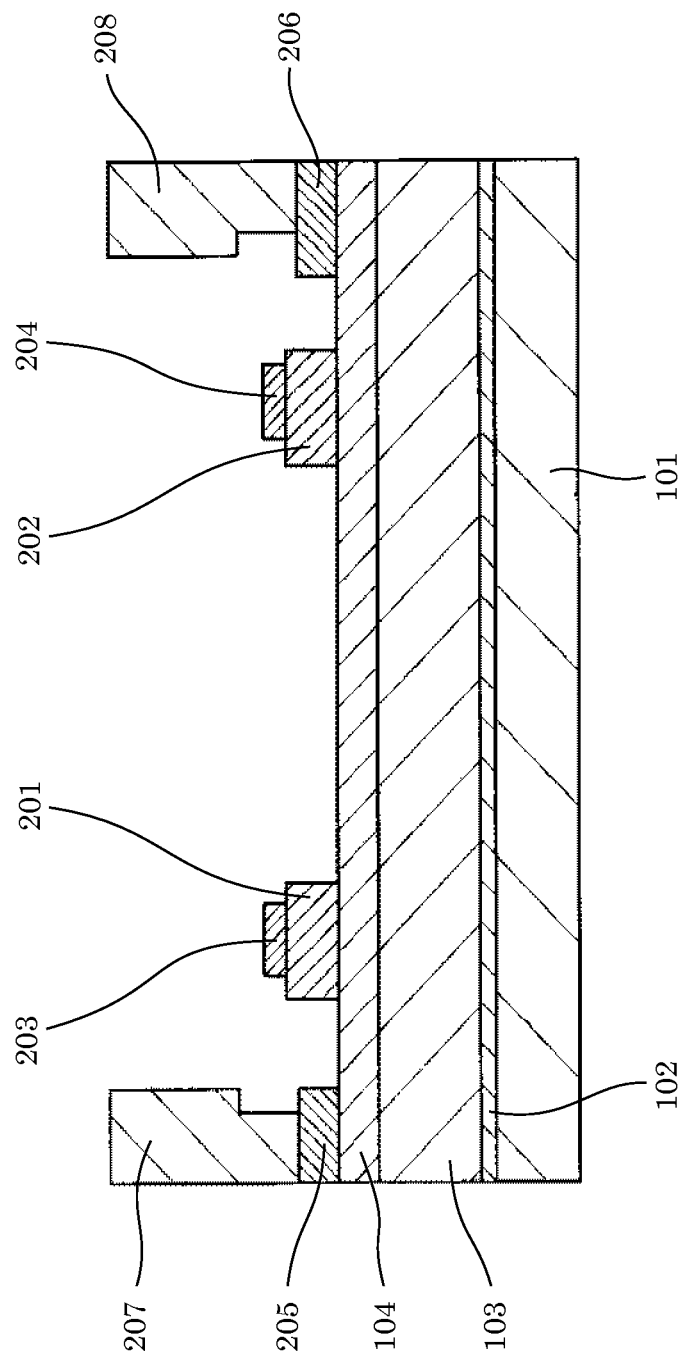
FIG. 16 is a cross-sectional view of a GaN-based bidirectional switch according to Embodiment 10 of the present disclosure.

Referring to FIG. 15 and FIG. 16, a description will be given of a structure of a semiconductor device according to Embodiment 10 in which a surge protection element and a GaN based bidirectional switch are integrated.

FIG. 15 is a plan view of a semiconductor device according to Embodiment 10. Surge protection element region 215 may have a structure substantially the same as those illustrated in FIG. 10, FIG. 11, FIG. 12A, FIG. 12B, and FIG. 12C; and thus, detailed description thereof is not given.

FIG. 16 is a cross-sectional view taken along line XVI-XVI in FIG. 15. Third gate electrode 203 is disposed between third ohmic electrode 205 and fourth gate electrode 204. Fourth gate electrode 204 is disposed between third gate electrode 203 and fourth ohmic electrode 206. Third p-type GaN layer 201 is disposed between third gate electrode 203 and AlGaN layer 104. Fourth p-type GaN layer 202 is disposed between fourth gate electrode 204 and AlGaN layer 104.

Third ohmic electrode 205 and fourth ohmic electrode 206 each comprise, for example, Au and Ti. Third gate electrode 203 and fourth gate electrode 204 each comprise, for example, Pd and Au.

The semiconductor device illustrated in FIG. 15 includes third gate electrode line 209, fourth gate electrode line 210, third gate electrode pad 211, fourth gate electrode pad 212, third ohmic electrode pad 213, and fourth ohmic electrode pad 214. Active region 216 is formed in the central portion, and inactive region 217 is formed outside of active region 216.

Since the surge protection elements according to Embodiment 1, Embodiment 5, and Embodiment 6 each have a symmetric structure, the surge protection elements can have both positive and negative clamp voltages and can conduct current. Connection of a bidirectional switch which withstands both positive and negative voltages to a surge protection element according to any one of Embodiment 1, Embodiment 5, and Embodiment 6 substantially and significantly increases the avalanche resistance for positive and negative voltages. Additionally, a semiconductor device which also operates as a bidirectional switch which controls bidirectional current can be configured with a single chip.

In the case where the surge protection element according to Embodiment 1 is connected in parallel with the bidirectional switch, third ohmic electrode 205 of the bidirectional switch is electrically connected to first electrode 111 of the surge protection element via third ohmic electrode line 207, and fourth ohmic electrode 206 of the bidirectional switch is electrically connected to second electrode 112 of the surge protection element via fourth ohmic electrode line 208.

In the case where the bidirectional switch is connected in parallel with the surge protection element according to Embodiment 5 or Embodiment 6, third ohmic electrode 205 of the bidirectional switch is electrically connected to first ohmic electrode 113 of the surge protection element via third ohmic electrode line 207, and fourth ohmic electrode 206 of the bidirectional switch is electrically connected to second ohmic electrode 114 of the surge protection element via fourth ohmic electrode line 208.

Although Embodiments 7 to 10 have described the examples where the surge protection elements are disposed in the approximately central portion of the semiconductor device, the position of the surge protection elements may be other than the central portion. Moreover, assuming that a surge protection element including single finger-shaped first electrode 111, single first p-type GaN layer 109, single finger-shaped second electrode 112 and single second p-type GaN layer 110 is one cell, it may be that the cell and a cell of a GaN transistor including at least drain electrode 106, source electrode 105, and gate electrode 108 are alternately arranged. It may also be that one cell of the surge protection element is arranged relative to a plurality of GaN transistor cells. Such structures allow heat generated by the surge protection element to be dispersed, allowing larger current to be conducted through the surge protection element.

Embodiments 7 to 10 have described the examples where a normally-off GaN transistor including p-type GaN layer 107 is integrated. However, the transistor may be, for example, a so-called AlGaN/GaN field-effect transistor including no p-type GaN layer 107 and including gate electrode 108 directly in contact with AlGaN layer 104. Moreover, the transistor may be a MIS GaN transistor including, instead of p-type GaN layer 107, an insulating film of, for example, silicon dioxide, silicon nitride, aluminum nitride, or aluminum oxide, or may be a GaN transistor including gate electrode 108 which forms a schottky junction with p-type GaN layer 107.

Embodiments 1 to 10 have described the examples where first electrode 111 and second electrode 112 each comprise Pd and Au as electrode materials. However, the materials may be other metal materials which form an ohmic contact with a p-type GaN layer, and may be, for example, nickel (Ni), indium tin oxide, zinc indium tin oxide, or indium gallium zinc oxide.

The examples have been described where first p-type GaN layer 109 and second p-type GaN layer 110 are used as p-type semiconductors, but other semiconductors, for example, a p-type AlGaN layer or a p-type InGaN layer, may be used which have lattice matching with an AlGaN layer.

The examples have been described above where the GaN transistor and the surge protection element are formed on an Si-substrate. However, the substrate may be any substrate which allows a GaN transistor to be formed thereon. For example, the substrate may be a sapphire substrate, silicon carbide (Sic) substrate, or a GaN substrate.

Moreover, buffer layer 102 may comprise an aluminum nitride (AlN) layer, or may comprise a GaN layer or a nitride semiconductor layer with any composition ratio which allows satisfactory GaN crystals to be formed on the buffer layer.

Moreover, at least a portion of AlGaN layer 104 may be covered with a SiN layer or an AlN layer. Such a structure protects the semiconductor device and the GaN transistor.

The surge protection element and the semiconductor device according to the present disclosure are very useful as power semiconductors which are used for power conversion apparatuses such as a power supply and an inverter.

What is claimed is:

1. A surge protection element comprising:
   a substrate;
   a semiconductor multi-layer disposed above the substrate, the semiconductor multi-layer including a channel and comprising a nitride semiconductor;
   a first p-type semiconductor layer and a second p-type semiconductor layer which are disposed above the semiconductor multi-layer;
   a first electrode disposed above the first p-type semiconductor layer; and
   a second electrode disposed above the second p-type semiconductor layer.

2. The surge protection element according to claim 1, further comprising:
   a first ohmic electrode disposed above the semiconductor multi-layer;
   a second ohmic electrode disposed above the semiconductor multi-layer; and
   a first resistance,
   wherein the first p-type semiconductor layer is disposed between the first ohmic electrode and the second p-type semiconductor layer,
   the second p-type semiconductor layer is disposed between the first p-type semiconductor layer and the second ohmic electrode, and
   the first ohmic electrode is electrically connected to the first electrode via the first resistance, and the second ohmic electrode is electrically connected to the second electrode.

3. The surge protection element according to claim 1, further comprising:
   a first ohmic electrode disposed above the semiconductor multi-layer;
   a second ohmic electrode disposed above the semiconductor multi-layer; and
   a first diode including the first electrode as an anode and the first ohmic electrode as a cathode,
   wherein the first p-type semiconductor layer is disposed between the first ohmic electrode and the second p-type semiconductor layer,
   the second p-type semiconductor layer is disposed between the first p-type semiconductor layer and the second ohmic electrode,
   the first ohmic electrode is electrically connected to the first electrode via the first diode, and
   the second ohmic electrode is electrically connected to the second electrode.

4. The surge protection element according to claim 2, further comprising:
   a first diode including the first electrode as an anode and the first ohmic electrode as a cathode,
   wherein the first ohmic electrode is electrically connected to the first electrode via the first diode, and
   the first diode is connected in parallel with the first resistance.

5. The surge protection element according to claim 2, further comprising:
   a second resistance,
   wherein the second ohmic electrode is electrically connected to the second electrode via the second resistance.

6. The surge protection element according to claim 4, further comprising:
   a second resistance; and
   a second diode including the second ohmic electrode as a cathode and the second electrode as an anode,
   wherein the second ohmic electrode is electrically connected to the second electrode via the second resistance, and the second ohmic electrode is electrically connected to the second electrode via the second diode.

7. A semiconductor device comprising:
   the surge protection element according to claim 1; and
   a nitride semiconductor transistor including a source electrode, a drain electrode, and a gate electrode which are disposed above the semiconductor multi-layer,
   wherein the source electrode is electrically connected to the first electrode of the surge protection element, and
   the drain electrode is electrically connected to the second electrode of the surge protection element.

8. A semiconductor device comprising:
   the surge protection element according to claim 2; and
   a nitride semiconductor transistor including a source electrode, a drain electrode, and a gate electrode which are disposed above the semiconductor multi-layer,
   wherein the source electrode is electrically connected to the first ohmic electrode of the surge protection element, and
   the drain electrode is electrically connected to the second ohmic electrode of the surge protection element.

9. The semiconductor device according to claim 8, wherein the first resistance includes a portion of the first p-type semiconductor layer.

10. The semiconductor device according to claim 8, wherein the first resistance includes a portion of the semiconductor multi-layer.

11. The semiconductor device according to claim 8, wherein the first resistance includes a portion of a metal film.

12. A semiconductor device comprising:
    the surge protection element according to claim 3; and
    a nitride semiconductor transistor including a source electrode, a drain electrode, and a gate electrode which are disposed above the semiconductor multi-layer,
    wherein the source electrode is electrically connected to the first ohmic electrode of the surge protection element, and
    the drain electrode is electrically connected to the second ohmic electrode of the surge protection element.

13. The semiconductor device according to claim 12, wherein the first diode includes a portion of the first p-type semiconductor and a portion of the semiconductor multi-layer.

14. The semiconductor device according to claim 12, wherein the first diode includes a schottky electrode and a portion of the semiconductor multi-layer.

15. The semiconductor device according to claim 7, further comprising a p-type semiconductor layer disposed between the semiconductor multi-layer and the gate electrode.

16. A semiconductor device comprising:
    the surge protection element according to claim 1; and
    a nitride semiconductor bidirectional switch including a third ohmic electrode, a fourth ohmic electrode, a third gate electrode, and a fourth gate electrode which are disposed above the semiconductor multi-layer,
    wherein the third ohmic electrode is electrically connected to the first electrode, and
    the fourth ohmic electrode is electrically connected to the second electrode.

17. A semiconductor device comprising:
    the surge protection element according to claim 5; and
    a nitride semiconductor bidirectional switch including a third ohmic electrode, a fourth ohmic electrode, a third gate electrode, and a fourth gate electrode which are disposed above the semiconductor multi-layer, wherein the third ohmic electrode is electrically connected to the first ohmic electrode, and the fourth ohmic electrode is electrically connected to the second ohmic electrode.

18. The semiconductor device according to claim 17, further comprising:

a third p-type semiconductor layer disposed between the semiconductor multi-layer and the third gate electrode; and a fourth p-type semiconductor layer disposed between the semiconductor multi-layer and the fourth gate electrode.

19. The surge protection element according to claim 1, wherein a current flows through the second electrode and the first electrode in this order, when a voltage of the second electrode is greater than a voltage of the first electrode by a predetermined voltage or more.

20. The surge protection element according to claim 19, wherein the predetermined voltage is set by a distance between an end of the first p-type semiconductor layer on the second p-type semiconductor layer side and an end of the second p-type semiconductor layer on the first p-type semiconductor layer side.

* * * * *